(12) United States Patent
Hatakeyama et al.

(10) Patent No.: US 9,852,878 B2
(45) Date of Patent: Dec. 26, 2017

(54) SURFACE PROCESSING APPARATUS

(71) Applicant: EBARA CORPORATION, Tokyo (JP)

(72) Inventors: Masahiro Hatakeyama, Tokyo (JP); Kenichi Suematsu, Tokyo (JP); Ryo Tajima, Tokyo (JP); Kiwamu Tsukamoto, Tokyo (JP); Kenji Terao, Tokyo (JP); Shoji Yoshikawa, Tokyo (JP)

(73) Assignee: EBARA CORPORATION, Tokyo (JP)

(*) Notice: Subject to any disclaimer, the term of this patent is extended or adjusted under 35 U.S.C. 154(b) by 0 days.

(21) Appl. No.: 14/747,488

(22) Filed: Jun. 23, 2015

(65) Prior Publication Data
US 2015/0371813 A1 Dec. 24, 2015

(30) Foreign Application Priority Data

Jun. 24, 2014 (JP) .................................. 2014-128914
Feb. 2, 2015 (JP) .................................. 2015-018238

(51) Int. Cl.
| | | |
|---|---|---|
| *H01J 37/20* | (2006.01) | |
| *H01J 37/22* | (2006.01) | |
| *H01J 37/305* | (2006.01) | |
| *H01J 37/30* | (2006.01) | |
| *H01J 37/302* | (2006.01) | |
| *H01J 37/317* | (2006.01) | |

(52) U.S. Cl.
CPC ............ *H01J 37/20* (2013.01); *H01J 37/226* (2013.01); *H01J 37/3005* (2013.01); *H01J 37/3023* (2013.01); *H01J 37/3056* (2013.01); *H01J 37/3177* (2013.01); *H01J 2237/24535* (2013.01)

(58) Field of Classification Search
CPC .............. H01J 37/3056; H01J 37/3174; H01J 37/3175; H01J 37/073; H01J 2237/31776; H01J 2237/31779; H01J 2237/24535; H01J 37/20; H01J 37/226; H01J 37/228; H01J 37/3005; H01J 37/3023; H01J 37/3177
See application file for complete search history.

(56) References Cited

U.S. PATENT DOCUMENTS

| | | | | |
|---|---|---|---|---|
| 3,843,916 A | * | 10/1974 | Trotel ................. | H01J 37/3056 148/DIG. 106 |
| 4,572,956 A | * | 2/1986 | Tojo ..................... | H01J 37/3175 250/492.2 |
| 5,932,966 A | * | 8/1999 | Schneider ............. | H01J 37/073 313/530 |

(Continued)

FOREIGN PATENT DOCUMENTS

| | | |
|---|---|---|
| JP | 05-047643 A | 2/1993 |
| JP | 2002-270499 A | 9/2002 |

*Primary Examiner* — Wyatt Stoffa
(74) *Attorney, Agent, or Firm* — Pearne & Gordon LLP

(57) ABSTRACT

A surface processing apparatus is an apparatus which performs surface processing on an inspection object 20 by irradiating the inspection object with an electron beam. A surface processing apparatus includes: an electron source 10 (including lens system that controls beam shape of electron beam) which generates an electron beam; a stage 30 on which an inspection object 20 to be irradiated with the electron beam is set; and an optical microscope 110 for checking a position to be irradiated with the electron beam. The current value of the electron beam which irradiates the inspection object 20 is set at 10 nA to 100 A.

8 Claims, 22 Drawing Sheets

(56) References Cited

U.S. PATENT DOCUMENTS

| | | | |
|---|---|---|---|
| 6,207,117 B1* | 3/2001 | Takamatsu | H01J 37/02 250/398 |
| 6,762,421 B2* | 7/2004 | Nakasugi | H01J 37/3174 250/491.1 |
| 6,989,546 B2* | 1/2006 | Loschner | H01J 37/3177 250/492.2 |
| 7,095,037 B2* | 8/2006 | Fernadez | H01J 37/073 250/492.2 |
| 8,188,451 B1* | 5/2012 | Nasser-Ghodsi | H01J 37/073 250/493.1 |
| 2002/0074226 A1* | 6/2002 | Murakami | H01J 37/32055 204/298.41 |
| 2005/0236109 A1* | 10/2005 | Masuda | H01J 37/32504 156/345.27 |
| 2008/0078957 A1* | 4/2008 | Graf | H01J 37/08 250/492.21 |
| 2008/0135776 A1* | 6/2008 | Dzengeleski | B82Y 25/00 250/397 |
| 2008/0173329 A1* | 7/2008 | Namikawa | H01L 21/6835 134/6 |

* cited by examiner

FIG.17
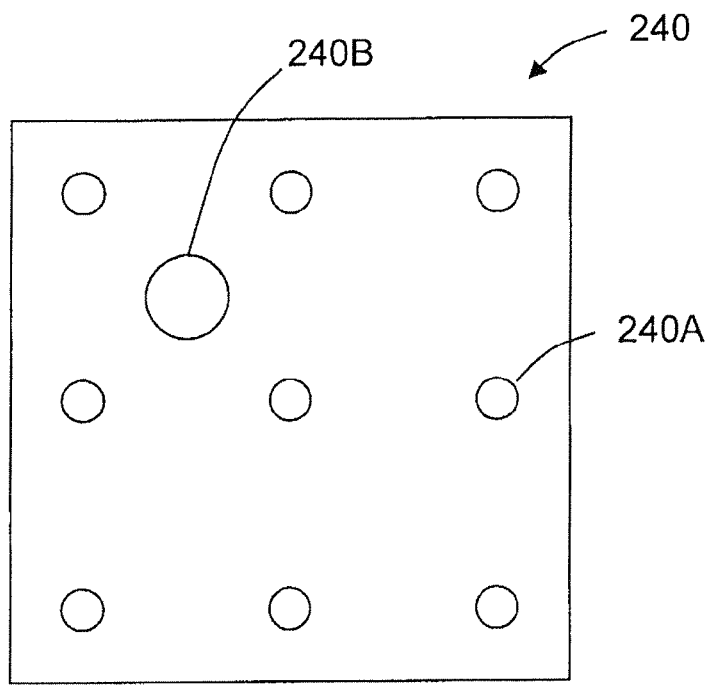
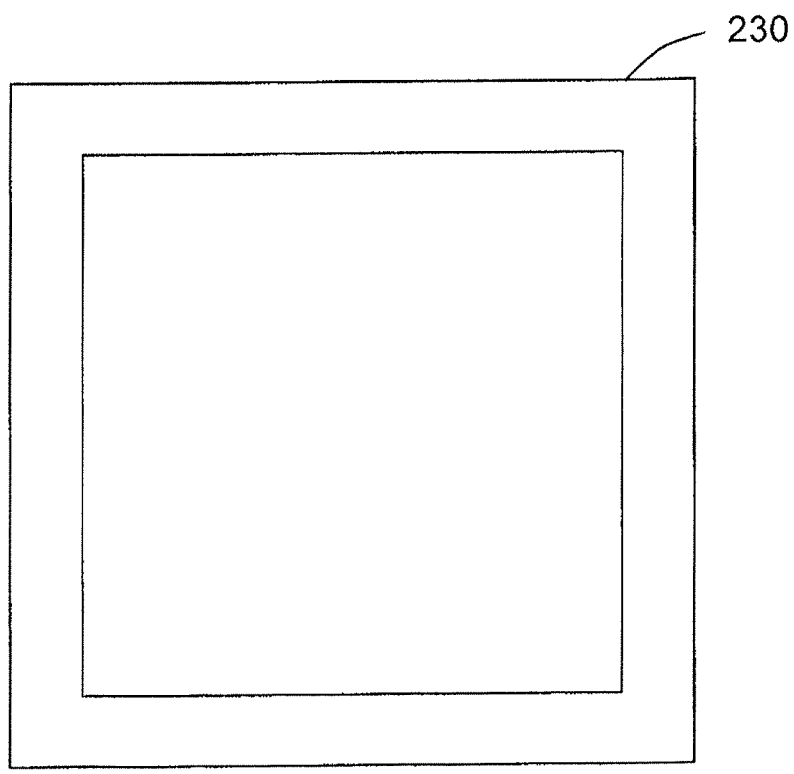

SURFACE PROCESSING APPARATUS

CROSS-REFERENCE TO RELATED APPLICATIONS

This application claims the benefit of Japanese Priority Patent Applications JP 2014-128914 filed on Jun. 24, 2014 and JP 2015-018238 filed on Feb. 2015, the entire contents of which are incorporated herein by reference.

FIELD

The present technology relates to a surface processing apparatus which performs surface processing on an inspection object by irradiating the inspection object with an electron beam, and particularly relates to a technology of the surface processing which uses a high-current electron beam.

BACKGROUND AND SUMMARY

In a field of a semiconductor manufacture, a surface processing apparatus has been conventionally used which performs surface processing on an inspection object by irradiating the inspection object with an electron beam. For instance, an electron beam exposure device is used which exposes a pattern of a semiconductor chip by using an electron beam (see Japanese Patent Laid-Open No. H5-47643). In addition, in recent years, an exposure device is also proposed which transfers the whole of a chip area by irradiating the chip area with charged particles over a large area (see Japanese Patent Application Laid-Open No. 2002-270499).

However, in the conventional exposure device, the current value of the electron beam which irradiates the inspection object has been as small as approximately 1 nA at most. Because of this, it has been difficult to perform the surface processing on the inspection object at high speed, and it has been desired to enhance the throughput.

It has been desired to provide a surface processing apparatus which can treat the inspection object at high speed and can enhance the throughput.

A surface processing apparatus in one embodiment is a surface processing apparatus which performs surface processing on an inspection object by irradiating the inspection object with an electron beam, and includes: an electron source which generates the electron beam; a lens system which controls a beam shape of the electron beam; a stage on which the inspection object to be irradiated with the electron beam is set; and an optical microscope for checking a position to be irradiated with the electron beam, wherein a current value of the electron beam which irradiates the inspection object is set at 10 nA to 100 A.

A surface processing apparatus in another embodiment is a surface processing apparatus which performs surface processing on an inspection object by irradiating the inspection object with electron beams, and includes: a plurality of electron sources which generate the electron beams, respectively; a plurality of lens systems which control beam shapes of the electron beams emitted from the plurality of electron sources, respectively; a stage on which the inspection object to be irradiated with the electron beams is set; and an optical microscope for checking positions to be irradiated with the electron beams, wherein a current value of the electron beams which irradiate the inspection object is set at 10 nA to 100 A.

A surface processing apparatus in further another embodiment is a surface processing apparatus which performs surface processing on an inspection object by irradiating the inspection object with an electron beam, and includes: a light source which generates light having a predetermined wavelength; a photoelectric cathode which generates the electron beam by being irradiated with the light emitted from the light source; a stage on which the inspection object to be irradiated with the electron beam is set; and an optical microscope for checking a position to be irradiated with the electron beam, wherein a current value of the electron beam which irradiates the inspection object is set at 10 nA to 100 A.

BRIEF DESCRIPTION OF DRAWINGS

FIG. 17 is a view showing a structure of a beam adjustment jig (plate) and a rectangular aperture (cover) according to the ninth embodiment.

DETAILED DESCRIPTION OF NON-LIMITING EXAMPLE EMBODIMENTS

Figure 1:
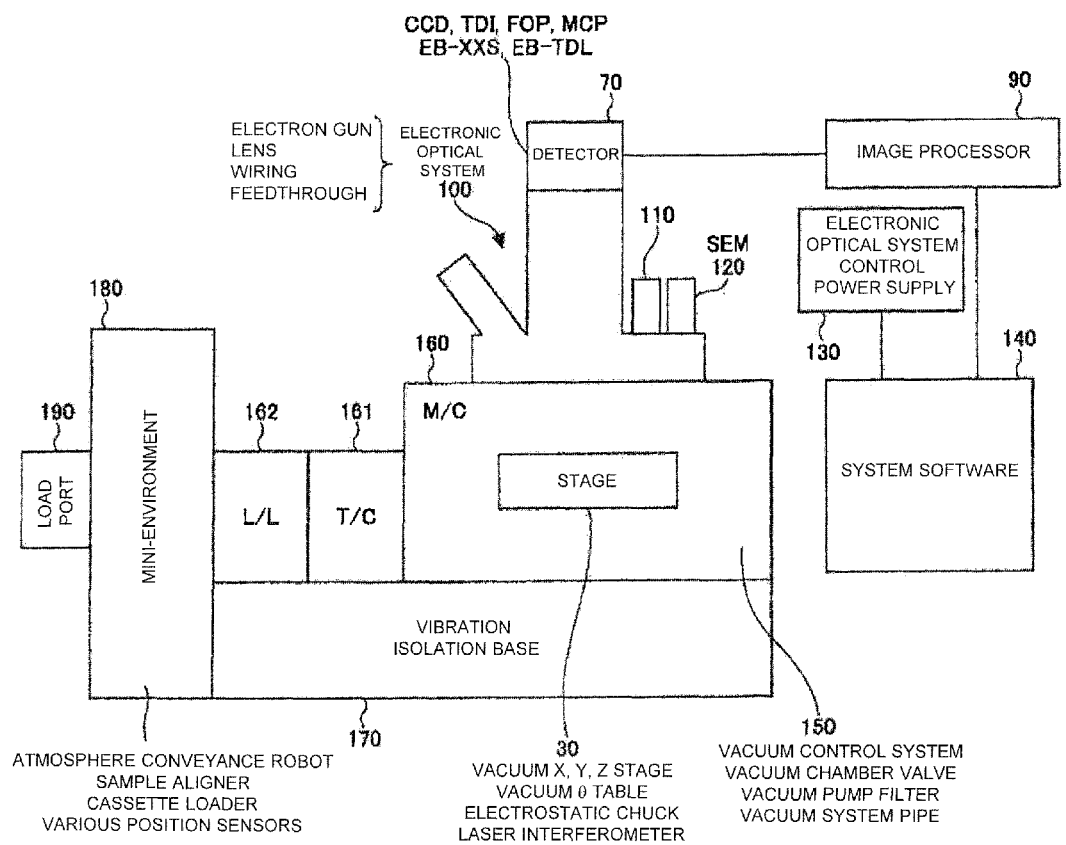
FIG. 1 is a view showing an overall structure of a surface processing apparatus according to a first embodiment.

Surface processing apparatuses in embodiments will be described below. Incidentally, each of embodiments which will be described below shows one example in the case where the present technology is carried out, and the present technology is not limited by specific structures which will be described below. When the present technology is carried out, a specific structure according to the embodiments may be appropriately adopted.

A surface processing apparatus in one embodiment is a surface processing apparatus which performs surface processing on an inspection object by irradiating the inspection object with an electron beam, and includes: an electron source which generates the electron beam; a lens system which controls a beam shape of the electron beam; a stage on which the inspection object to be irradiated with the electron beam is set; and an optical microscope for checking a position to be irradiated with the electron beam, wherein a current value of the electron beam which irradiates the inspection object is set at 10 nA to 100 A.

By having this structure, the surface processing apparatus can perform surface processing on the inspection object by irradiating the inspection object with the electron beam. In this case, the current value of the electron beam that irradiates the inspection object is set at 10 nA to 100 A, which accordingly enables high speed processing and greatly enhances the throughput, as compared to a conventional apparatus.

A surface processing apparatus in one embodiment is a surface processing apparatus which performs surface processing on an inspection object by irradiating the inspection object with electron beams, and includes: a plurality of electron sources which generate the electron beams, respectively; a plurality of lens systems which control beam shapes of the electron beams emitted from the plurality of electron sources, respectively; a stage on which the inspection object to be irradiated with the electron beams is set; and an optical microscope for checking positions to be irradiated with the electron beams, wherein a current value of the electron beams which irradiate the inspection object is set at 10 nA to 100 A.

By having this structure, the surface processing apparatus can perform the surface processing on the inspection object by irradiating the inspection object with the electron beams. In this case, the plurality of electron sources and the plurality of lens systems are used, and thereby electron beams over a large area can be generated with the use of small-sized electron sources (inexpensive electron sources). In addition, the current value of the electron beams that irradiate the inspection object is set at 10 nA to 100 A, which accordingly enables high speed processing and greatly enhances the throughput, as compared to a conventional apparatus.

A surface processing apparatus in one embodiment is a surface processing apparatus which performs surface processing on an inspection object by irradiating the inspection object with an electron beam, and includes: light source which generates light having a predetermined wavelength; a photoelectric cathode which generates the electron beam by being irradiated with the light emitted from the light source; a stage on which the inspection object to be irradiated with the electron beam is set; and an optical microscope for checking a position to be irradiated with the electron beam, wherein a current value of the electron beam which irradiates the inspection object is set at 10 nA to 100 A.

By having this structure, the surface processing apparatus can perform the surface processing on the inspection object by irradiating the inspection object with the electron beam. In this case, the photoelectric cathode is used, and thereby an electron beam over a large area can be generated. In addition, the current value of the electron beam that irradiates the inspection object is set at 10 nA to 100 A, which accordingly enables high speed processing and greatly enhances the throughput, as compared to a conventional apparatus.

In addition, in a surface processing apparatus in one embodiment, the inspection object has a circular shape, a region which is irradiated with an electron beam has a fan shape, and the surface processing apparatus may have a stage control unit which rotationally moves the stage so that the whole surface of the inspection object can be irradiated with the electron beam.

In this structure, the inspection object having the circular shape is irradiated with the electron beam in the fan shape. In this case, the surface processing apparatus rotationally moves the stage, and thereby can irradiate the whole surface of the inspection object with the electron beam.

In addition, in a surface processing apparatus in one embodiment, the inspection object has a rectangular shape, a region which is irradiated with the electron beam has a rectangular shape with a smaller size than that of the inspection object, and the surface processing apparatus may have a stage control unit which translationally moves the stage so that the whole surface of the inspection object can be irradiated with the electron beam.

In this structure, the inspection object having the rectangular shape is irradiated with the electron beam having a rectangular shape (rectangular shape with smaller size than that of inspection object). In this case, the surface processing apparatus translationally moves the stage, and thereby can irradiate the whole surface of the inspection object with the electron beam.

In addition, in a surface processing apparatus in one embodiment, an electron source may be arranged below the stage, the inspection object may be set on the stage so that the surface to be subjected to the surface processing faces downward, and the electron beam may irradiate the inspection object from below.

In this structure, the inspection object is set on the stage so that the surface to be subjected to the surface processing faces downward, and the electron beam irradiates the inspection object from below. Thereby, such a phenomenon can be decreased that foreign substances, particles and the like fall and are deposited on the surface to be subjected to the surface processing, due to gravity.

The surface processing apparatus according to the present embodiment performs the surface processing by using a high-current electron beam, thereby enables the high speed processing and can enhance the throughput.

Surface processing apparatuses according to the embodiments of the present invention will be described below with reference to the drawings. The surface processing apparatus is an apparatus which performs surface processing on an inspection object by irradiating the inspection object with an electron beam. In the following, the case of the surface processing apparatus will be illustrated which performs the surface processing, for instance, of a film, a base material (wafer, mask, resist, oxide film, conductive film, quartz and the like) and the like.

First Embodiment

A structure of a surface processing apparatus in a first embodiment of the present invention will be described below with reference to the drawings. Here, firstly, the overall structure of the apparatus will be described, and then a main part of the apparatus will be described.

FIG. 1 is a view showing the overall structure of the surface processing apparatus according to the present embodiment. As is shown in FIG. 1, the surface processing apparatus includes: an electron beam column system 100; an optical microscope 110; an SEM type inspection device 120; a main chamber 160; a transfer chamber 161; a load lock 162; a mini environment 180; and a load port 190. The optical microscope 110 can be used for the alignment of the inspection object, and the like. In addition, the SEM 120 can be used for review observation and the like.

The mini environment 180 has a transfer robot in the atmosphere, an inspection object alignment device, a clean air supply mechanism and the like provided therein. The transfer chamber 161 has a transfer robot in the vacuum provided therein. The robot is arranged in the transfer chamber 161 which is always in the vacuum state, and accordingly the occurrence of the particles and the like can be reduced to the minimum, which is caused by the fluctuation of pressure.

On the main chamber 160, a stage 30 is provided which moves in an x direction, a y direction and a θ (rotation) direction, and on the stage 30, an electrostatic chuck is provided. In the electrostatic chuck, the inspection object itself is set. Alternatively, the inspection object is held by the electrostatic chuck in the state of being set in a palette or a holder.

The main chamber 160 is controlled by a vacuum control system 150 so that the inside of the chamber is kept in the vacuum state. In addition, the main chamber 160, the transfer chamber 161 and the load lock 162 are structured so as to be mounted on a shock absorbing stage 170, and to prevent vibration transmitted from the floor from being transmitted to the chambers and the load lock.

In addition, an electron optical system 100 is provided in the main chamber 160. This electron column 100 includes: an electron column system including a primary optical system and a secondary optical system; and a detector 70 that detects electrons which are secondarily emitted from the inspection object, mirror electrons and the like. The primary optical system includes an electron gun and a lens of a primary system. The secondary optical system includes a condensing lens, an E×B, a transfer lens, an NA adjustment aperture and a projection lens. The detector 70 is included in the secondary optical system. A signal sent from the detector 70 is transmitted to an image processing device 90, and is processed therein.

The image processing device 90 can perform both signal processing of on-time and signal processing of off-time. The signal processing of on-time is performed while the inspection is performed. When the signal processing of off-time is performed, only the image is acquired, and the signal processing is performed later. The data which has been processed in the image processing device 90 is stored in a recording medium such as a hard disk and a memory. In addition, the data can be displayed on a console monitor, as needed. In order to perform such signal processing, a system software 140 is provided. In addition, a control power source 130 for the electron optical system is provided in order to supply a power source to the electron column system.

The inspection object is transferred into the mini environment 180 by the load port 190, and an alignment operation is performed therein. The inspection object is transferred to the load lock 162 by the transfer robot in the air. The load lock 162 is evacuated from the atmosphere state to the vacuum state by a vacuum pump. When the pressure becomes a constant value (approximately 1 Pa) or less, the inspection object 20 is transferred from the load lock 162 to the main chamber 160 by the transfer robot in the vacuum, which is arranged in the transfer chamber 161. The inspection object 20 is set on the electrostatic chuck mechanism on the stage 30.

Figure 2:
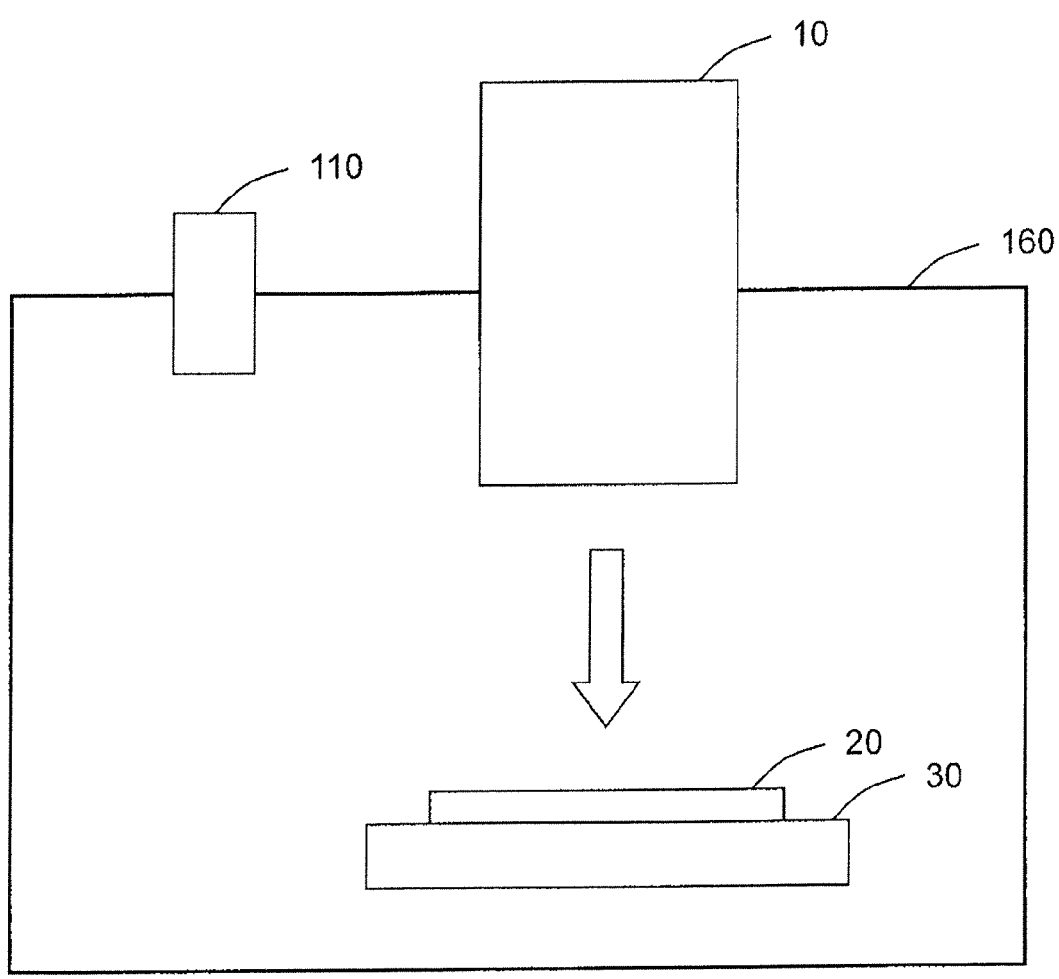
FIG. 2 is a view showing a structure of a main part of the surface processing apparatus according to the first embodiment.

FIG. 2 is a view showing a structure of a main part (main part including electron optical system and main chamber) of the surface processing apparatus according to the present embodiment. As is shown in FIG. 2, the surface processing apparatus has the electron source 10 which generates an electron beam. The electron source 10 has a lens system provided therein which controls the beam shape of the electron beam. In addition, the surface processing apparatus has the stage 30 on which the inspection object 20 to be irradiated with the electron beam is set. Furthermore, the surface processing apparatus has the optical microscope 110 for checking a position to be irradiated with the electron beam.

The current value of the electron beam which irradiates the inspection object 20 is set at 10 nA to 100 A. An LaB6 cathode, a hollow cathode, a tungsten filament and the like can be used for the electron source 10. A voltage of 0 to −5,000 V is applied to the electron source 10, and a voltage of 0 to −2,000 V is applied to the inspection object 20. A landing energy LE is set at 0 to 5,000 eV.

In this case, the region which is irradiated with the electron beam can be controlled by the movement of the stage 30. The position to be irradiated with the electron beam can be checked with the use of the optical microscope 110. In addition, the region which is irradiated with the electron beam can be controlled by the combination of the control of stage movement and the control of a blanking beam (dose control).

Such a surface processing apparatus of the present embodiment can perform the surface processing on the inspection object 20 by irradiating the inspection object 20 with the electron beam. In this case, the current value of the electron beam that irradiates the inspection object 20 is set at 10 nA to 100 A, which accordingly enables high speed processing and greatly enhances the throughput, as compared to a conventional apparatus.

Second Embodiment

A structure of a surface processing apparatus in a second embodiment of the present invention will be described below with reference to the drawing. Incidentally, the overall structure of the surface processing apparatus is similar to that in the first embodiment, and accordingly the description will be omitted here.

Figure 3:
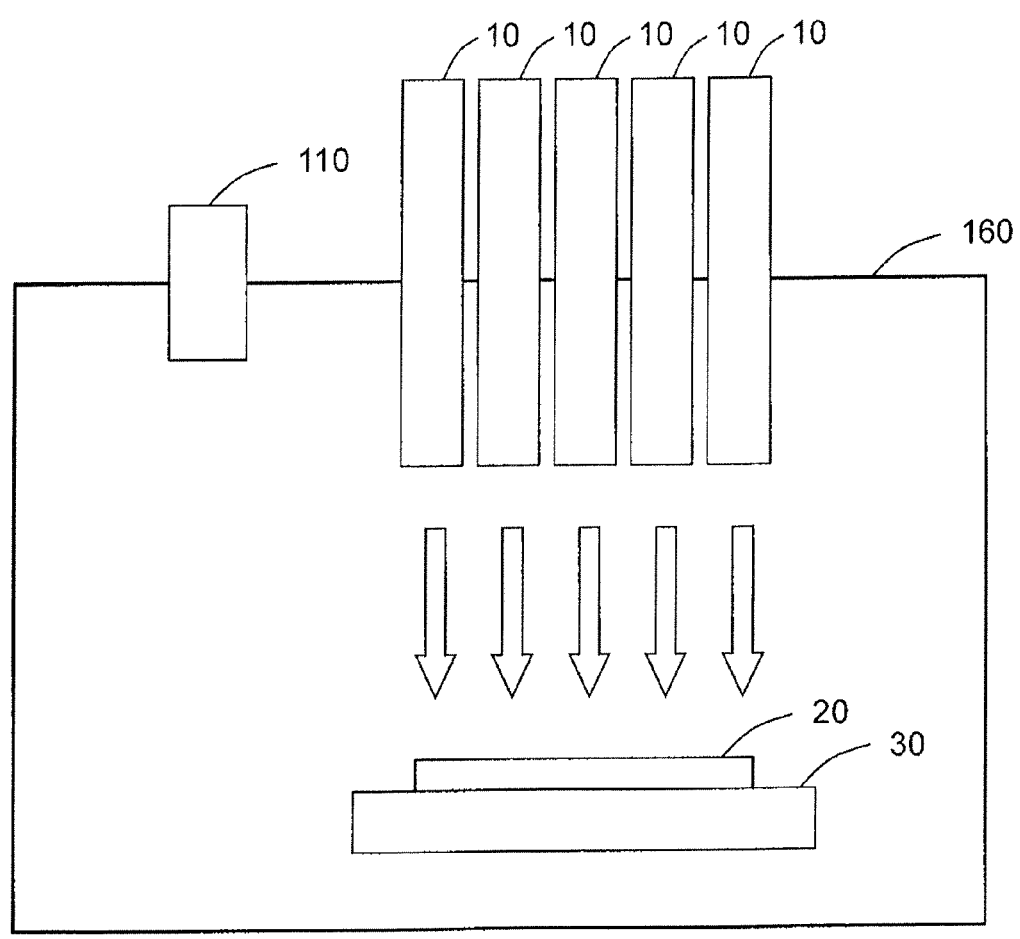
FIG. 3 is a view showing a structure of a main part of a surface processing apparatus according to a second embodiment.

FIG. 3 is a view showing a structure of a main part (main part including electron optical system and main chamber) of the surface processing apparatus in the present embodiment. As is shown in FIG. 3, the surface processing apparatus has a plurality of electron sources 10 which generate electron beams, respectively. The plurality of electron sources 10 have the respective lens systems which control the beam shapes of the electron beams, respectively. In addition, the surface processing apparatus has the stage 30 on which the inspection object 20 to be irradiated with the electron beams is set. Furthermore, the surface processing apparatus has the optical microscope 110 for checking positions to be irradiated with the electron beams.

The current value of the electron beams which irradiate the inspection object 20 is set at 10 nA to 100 A. The LaB6 cathode, the hollow cathode, the tungsten filament and the like can be used for the electron source 10. The voltage of 0 to −5,000 V is applied to the electron source 10, and the voltage of 0 to −2,000 V is applied to the inspection object 20. The landing energy LE is set at 0 to 5,000 eV.

In this case, a region which is irradiated with the electron beam can be controlled by the movement of the stage 30. The position to be irradiated with the electron beam can be checked with the use of the optical microscope 110. In addition, the region which is irradiated with the electron beam can be controlled by the combination of the control of stage movement and the control of a blanking beam (dose control).

Such a surface processing apparatus of the present embodiment can perform the surface processing on the inspection object 20 by irradiating the inspection object 20 with the electron beams. In this case, the plurality of electron sources 10 are bundled, and can be used as one electron source. Thus, the plurality of electron sources 10 (which contain plurality of respective lens systems) are used, and thereby electron beams having a large area can be generated with the use of small-sized electron sources (inexpensive electron sources). In addition, the current value of the electron beams that irradiate the inspection object 20 is set at 10 nA to 100 A, which accordingly enables high speed processing and greatly enhances the throughput, as compared to a conventional apparatus.

Third Embodiment

A structure of a surface processing apparatus in a third embodiment of the present invention will be described below with reference to the drawing. Incidentally, the overall structure of the surface processing apparatus is similar to that in the first embodiment, and accordingly the description will be omitted here.

Figure 4:
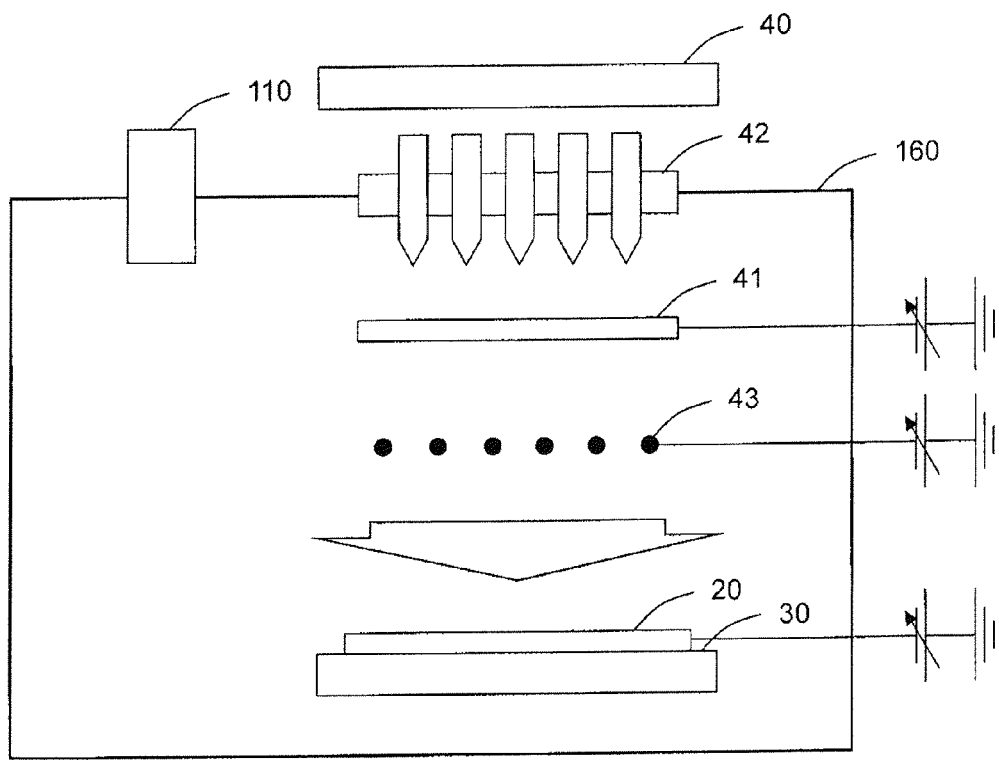
FIG. 4 is a view showing a structure of a main part of a surface processing apparatus according to a third embodiment.

FIG. 4 is a view showing a structure of a main part (main part including electron optical system and main chamber) of the surface processing apparatus in the present embodiment. As is shown in FIG. 4, the surface processing apparatus includes a light source 40 which generates light having a predetermined wavelength, and a photoelectric cathode 41 which generates the electron beam by being irradiated with the light emitted from the light source. The surface processing apparatus also includes the stage 30 on which the inspection object 20 to be irradiated with the electron beam is set. The surface processing apparatus further includes the optical microscope 110 for checking the position to be irradiated with the electron beam. Incidentally, the optical microscope 110 may be provided in the main chamber 160, or may also be provided in the load lock 162.

The light source 40 can be installed in the outside of the main chamber 160. In this case, the surface processing apparatus can be structured so that the light emitted from the light source 40 passes through a transmission window 42 which is provided in the main chamber 160 and reaches the photoelectric cathode 41. A synthetic quartz, quartz, an FOP (fiber optic plate) and the like can be used for the transmission window 42. The amount of electrons emitted from the photoelectric cathode 41, and the directivity and the equability of the electron beam can be controlled by a drawing electrode 43.

The current value of the electron beam which irradiates the inspection object 20 is set at 10 nA to 100 A. A DUV lamp, a DUV laser, an X-ray laser, a UV laser, a UV lamp, an LED, an LD and the like can be used for the light source 40. The voltage of 0 to −5,000 V is applied to the photoelectric cathode 41, and the voltage of 0 to −2,000 V is applied to the inspection object 20. A landing energy LE is set at 0 to 5,000 eV.

In this case, the region which is irradiated with the electron beam can be controlled by the movement of the stage 30. The position to be irradiated with the electron beam can be checked with the use of the optical microscope 110. In addition, the region which is irradiated with the electron beam can be controlled by the combination of the control of stage movement and the on/off control of the light source (dose control).

Such a surface processing apparatus of the present embodiment can perform the surface processing on the inspection object 20 by irradiating the inspection object 20 with the electron beam. In this case, the photoelectric cathode 41 is used, and thereby the electron beam over a large area can be generated. In addition, the current value of the electron beam that irradiates the inspection object 20 is set at 10 nA to 100 A, which accordingly enables high speed processing and greatly enhances the throughput, as compared to a conventional apparatus.

Fourth Embodiment

A structure of a surface processing apparatus in a fourth embodiment of the present invention will be described below with reference to the drawings. Incidentally, the overall structure of the surface processing apparatus is similar to that in the first embodiment, and accordingly the description will be omitted here.

Figure 5:
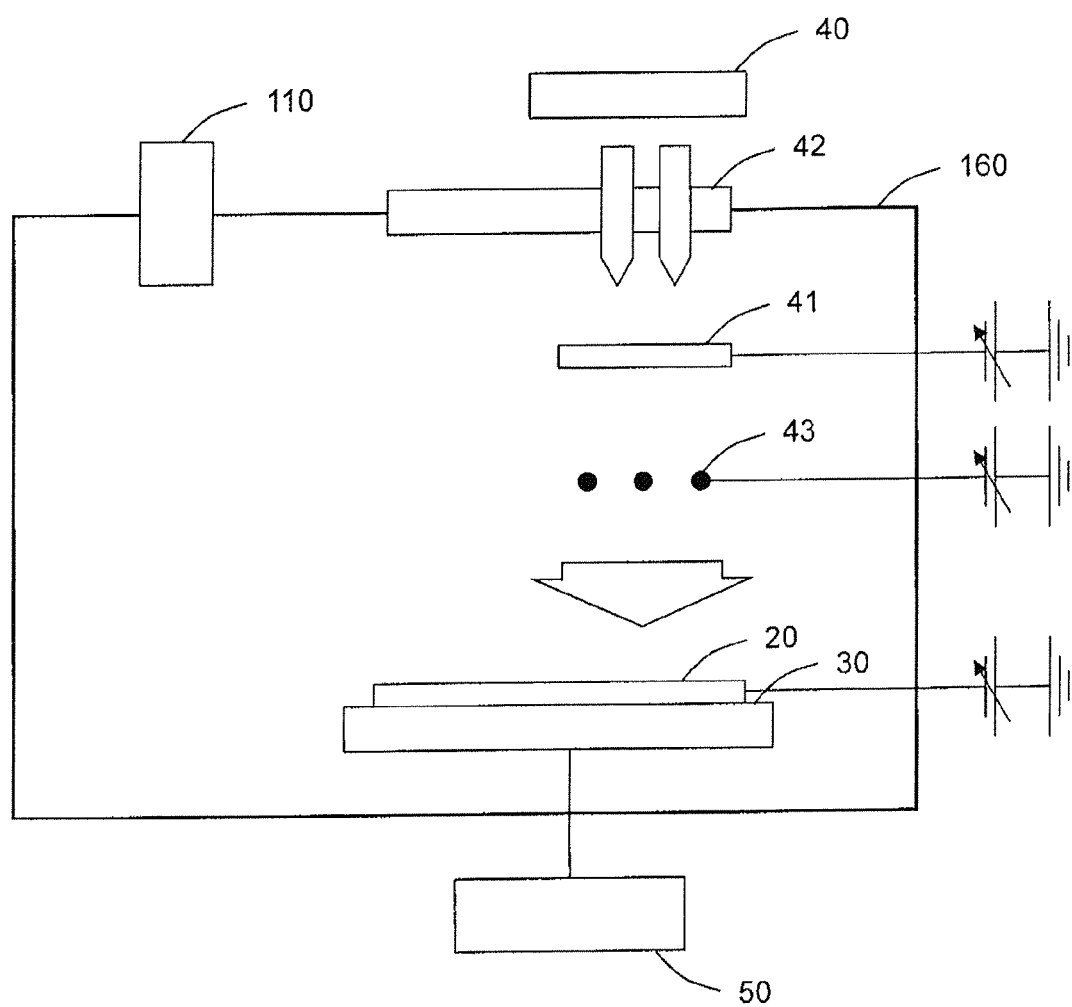
FIG. 5 is a view showing a structure of a main part of a surface processing apparatus according to a fourth embodiment.

FIG. 5 is a view showing a structure of a main part (main part including electron optical system and main chamber) of the surface processing apparatus in the present embodiment. As is shown in FIG. 5, the surface processing apparatus includes the light source 40 which generates light having a predetermined wavelength, and the photoelectric cathode 41 which generates the electron beam by being irradiated with the light emitted from the light source. The surface processing apparatus also includes the stage 30 on which the inspection object 20 to be irradiated with the electron beam is set. The surface processing apparatus further includes the optical microscope 110 for checking the position to be irradiated with the electron beam. Incidentally, the optical microscope 110 may be provided in the main chamber 160, or may also be provided in the load lock 162.

The light source 40 can be installed in the outside of the main chamber 160. In this case, the surface processing apparatus can be structured so that the light emitted from the light source 40 passes through the transmission window 42 which is provided in the main chamber 160 and reaches the photoelectric cathode 41. A synthetic quartz, quartz, an FOP (fiber optic plate) and the like can be used for the transmission window 42.

The amount of electrons emitted from the photoelectric cathode 41, and the directivity and the equability of the electron beam can be controlled by the drawing electrode 43. The surface processing apparatus has the drawing electrode 43 provided therein; and thereby can suppress the scattering of the electrons, reduce the electrons which irradiate a redundant region, and enhance electron generating efficiency by a drawing effect. Incidentally, the drawing electrode 43 does not necessarily need to be provided. When the drawing electrode 43 is not provided, the electron beam results in spreading (in other words, electron beam irradiates wide region), but the cost can be reduced.

The current value of the electron beam which irradiates the inspection object 20 is set at 10 nA to 100 A. A DUV lamp, a DUV laser, an X-ray laser, a UV laser, a UV lamp, an LED, an LD and the like can be used for the light source 40. The voltage of 0 to −5,000 V is applied to the photoelectric cathode 41, and the voltage of 0 to −2,000 V is applied to the inspection object 20. The landing energy LE is set at 0 to 5,000 eV.

Figure 6:
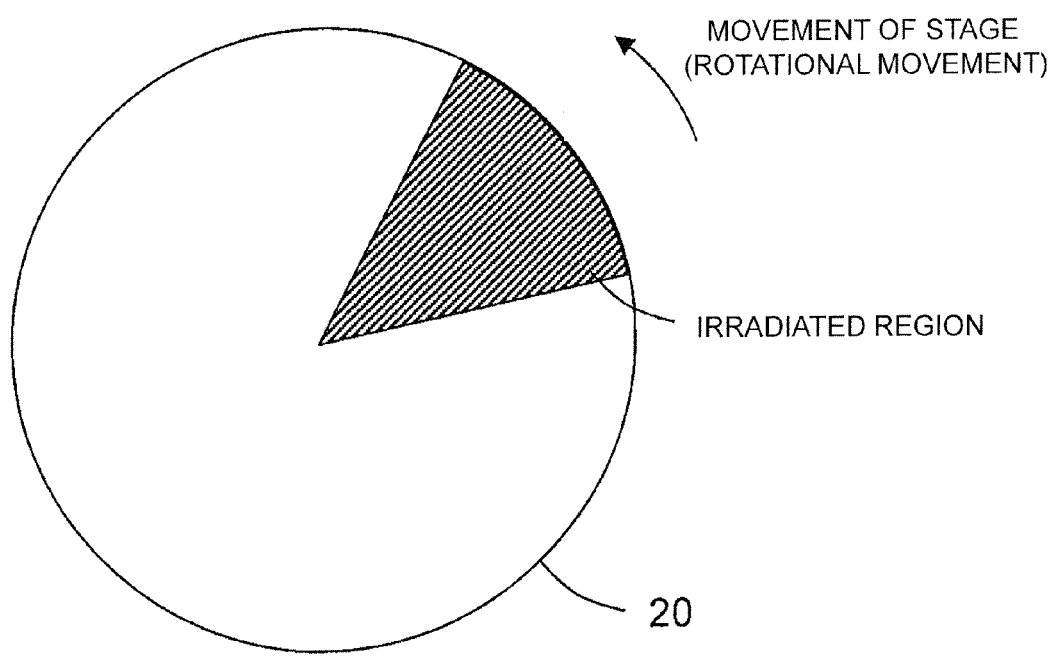
FIG. 6 is an explanatory view of an operation of the surface processing apparatus according to the fourth embodiment.

In the present embodiment, the inspection object 20 has a circular shape, and the region which is irradiated with the electron beam has a fan shape which constitutes a part of the circular shape (shape of inspection object 20) (see FIG. 6). Accordingly, the structure of the electron source such as the light source 40 and the photoelectric cathode 41 may be small as compared to that in the third embodiment. In this case, the surface processing apparatus has a stage control unit 50 which rotationally moves the stage 30 so that the whole surface of the inspection object 20 can be irradiated with the electron beam.

In this case, the stage 30 is rotationally moved and thereby the region which is irradiated with the electron beam can be controlled, by the control of the stage control unit 50. For instance, as is shown in FIG. 6, in the case where the shape of the region which is irradiated with the electron beam (which is shown by diagonal lines, in FIG. 6) is the fan shape which constitutes a part of the shape (circular shape) of the inspection object 20, the stage 30 is rotationally moved, and thereby the whole surface of the inspection object 20 can be uniformly irradiated with the electron beam.

Incidentally, the position to be irradiated with the electron beam can be checked with the use of the optical microscope 110. In addition, the region which is irradiated with the electron beam can be controlled by the combination of the control of stage movement and the on/off control of the light source (dose control).

Such a surface processing apparatus of the present embodiment can also perform the surface processing on the inspection object 20 by irradiating the inspection object 20 with the electron beam. In this case, the inspection object 20 having the circular shape is irradiated with the electron beam in the fan shape. In this case, the surface processing apparatus rotationally moves the stage 30, and thereby can uniformly irradiate the whole surface of the inspection object 20 with the electron beam.

Fifth Embodiment

A structure of a surface processing apparatus in a fifth embodiment of the present invention will be described below with reference to the drawings. Incidentally, the overall structure of the surface processing apparatus is similar to that in the first embodiment, and accordingly the description will be omitted here.

Figure 7:
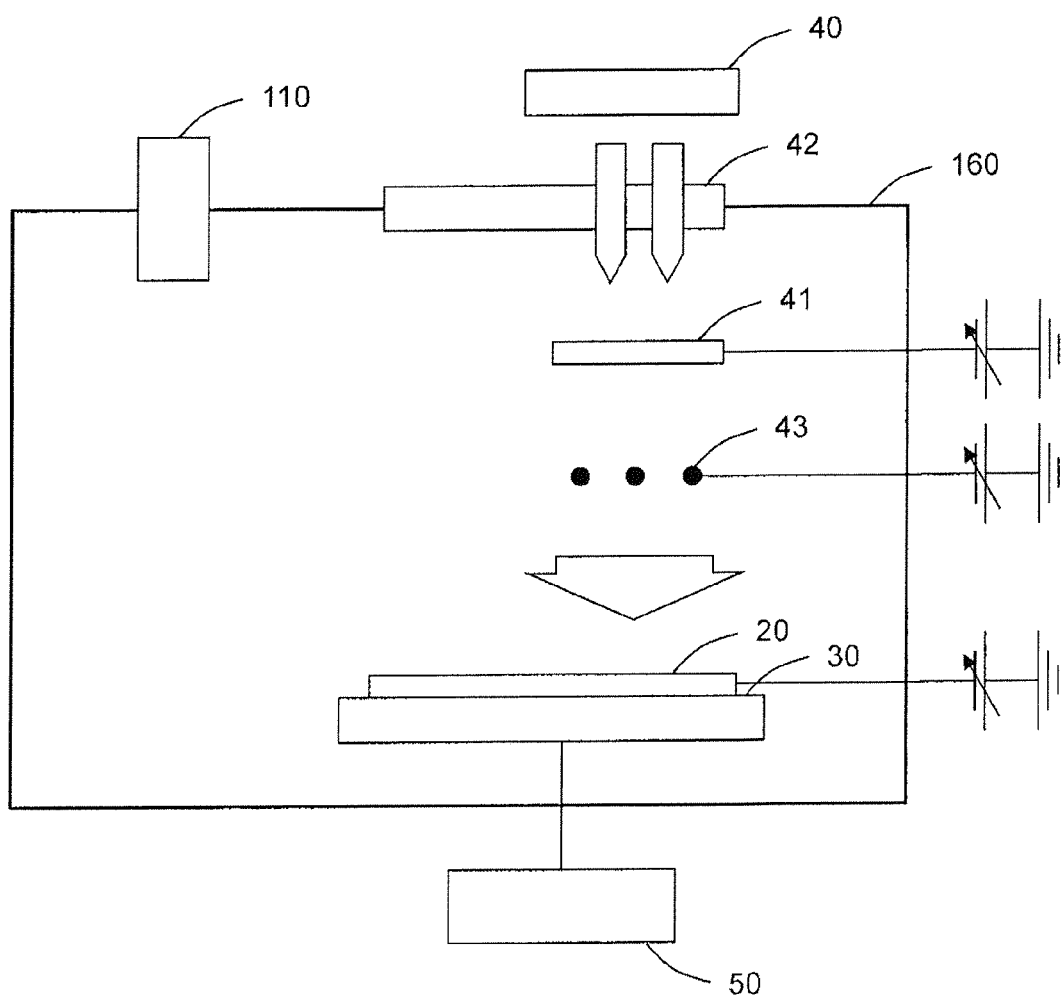
FIG. 7 is a view showing a structure of a main part of a surface processing apparatus according to a fifth embodiment.

FIG. 7 is a view showing a structure of the main part (main part including electron optical system and main chamber) of the surface processing apparatus in the present embodiment. As is shown in FIG. 7, the surface processing apparatus includes the light source 40 which generates light having a predetermined wavelength, and the photoelectric cathode 41 which generates the electron beam by being irradiated with the light emitted from the light source. The surface processing apparatus also includes the stage 30 on which the inspection object 20 to be irradiated with the electron beam is set. The surface processing apparatus further includes the optical microscope 110 for checking the position to be irradiated with the electron beam. Incidentally, the optical microscope 110 may be provided in the main chamber 160, or may also be provided in the load lock 162.

The light source 40 can be installed in the outside of the main chamber 160. In this case, the surface processing apparatus can be structured so that the light emitted from the light source 40 passes through the transmission window 42 which is provided in the main chamber 160 and reaches the photoelectric cathode 41. A synthetic quartz, quartz, an FOP (fiber optic plate) and the like can be used for the transmission window 42.

The amount of electrons emitted from the photoelectric cathode 41, and the directivity and the equability of the electron beam can be controlled by the drawing electrode 43. The surface processing apparatus has the drawing electrode 43 provided therein; and thereby can suppress the scattering of the electrons, reduce the electrons which irradiate a redundant region, and enhance the electron generating efficiency by the drawing effect. Incidentally, the drawing electrode 43 does not necessarily need to be provided. When the drawing electrode 43 is not provided, the electron beam results in spreading (in other words, electron beam irradiates wide region), but the cost can be reduced.

The current value of the electron beam which irradiates the inspection object 20 is set at 10 nA to 100 A. A DUV lamp, a DUV laser, an X-ray laser, a UV laser, a UV lamp, an LED, an LD and the like can be used for the light source 40. The voltage of 0 to −5,000 V is applied to the photoelectric cathode 41, and the voltage of 0 to −2,000 V is applied to the inspection object 20. The landing energy LE is set at 0 to 5,000 eV.

Figure 8:
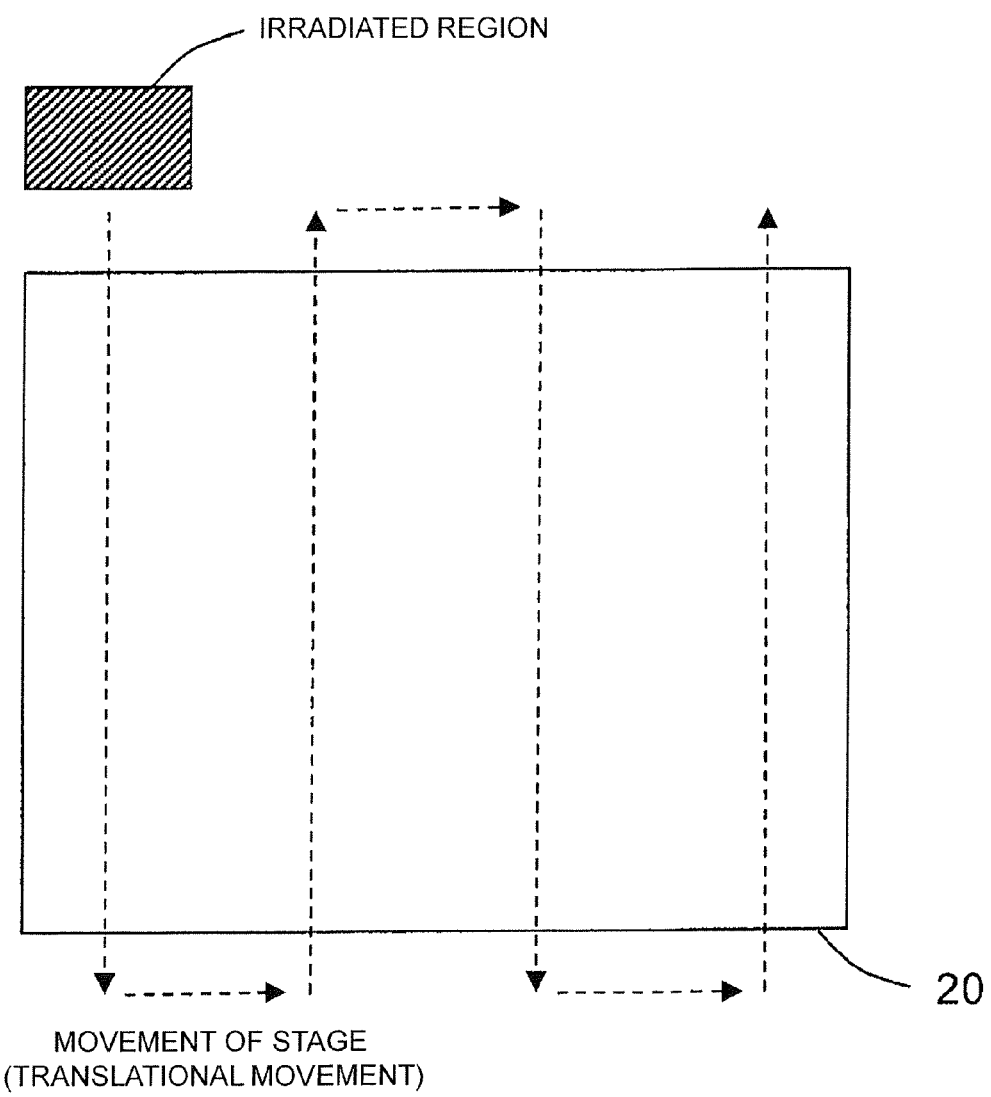
FIG. 8 is an explanatory view of an operation of the surface processing apparatus according to the fifth embodiment.

In the present embodiment, the inspection object 20 has a rectangular shape, and the region which is irradiated with the electron beam has a rectangular shape with a smaller size than that of the inspection object 20 (see FIG. 8). Accordingly, the structure of the electron source such as the light source 40 and the photoelectric cathode 41 may be small as compared to that in the third embodiment. In this case, the surface processing apparatus has a stage control unit 50 which translationally moves the stage 30 so that the whole surface of the inspection object 20 can be irradiated with the electron beam.

In this case, the stage 30 is translationally moved and thereby the region which is irradiated with the electron beam can be controlled, by the control of the stage control unit 50. For instance, as is shown in FIG. 8, in the case where the shape of the region which is irradiated with the electron beam (which is shown by diagonal lines, in FIG. 8) is the rectangular shape with a smaller size than that of the shape (rectangular shape) of the inspection object 20, the stage 30 is translationally moved, and thereby the whole surface of the inspection object 20 can be uniformly irradiated with the electron beam.

Incidentally, the position to be irradiated with the electron beam can be checked with the use of the optical microscope 110. In addition, the region which is irradiated with the electron beam can be controlled by the combination of the control of stage movement and the on/off control of the light source (dose control). For instance, the electron beam can also be controlled so as to irradiate only a specific partial region out of the inspection object 20 (controlled to irradiate spot).

Such a surface processing apparatus of the present embodiment can also perform the surface processing on the inspection object 20 by irradiating the inspection object 20 with the electron beam. In this case, the inspection object 20 having the rectangular shape is irradiated with the electron beam having the rectangular shape (rectangular shape with smaller size than that of inspection object 20). In this case, the surface processing apparatus translationally moves the stage 30, and thereby can irradiate the whole surface of the inspection object 20 with the electron beam. In addition, the electron beam can also be controlled so as to irradiate only a specific partial region out of the inspection object 20 (controlled to irradiate spot).

Sixth Embodiment

A structure of a surface processing apparatus in a sixth embodiment of the present invention will be described below with reference to the drawing. Incidentally, the overall structure of the surface processing apparatus is similar to that in the first embodiment, and accordingly the description will be omitted here.

Figure 9:
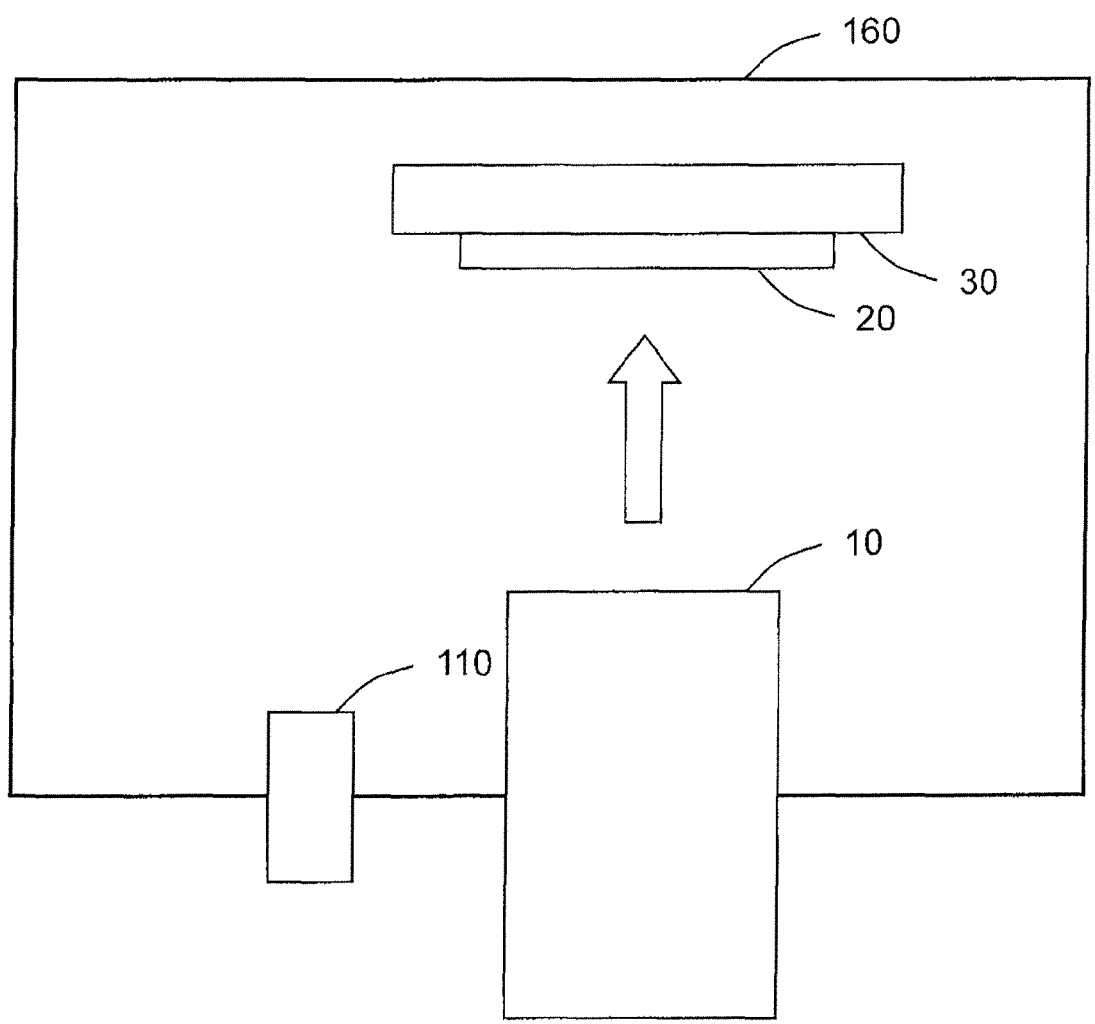
FIG. 9 is a view showing a structure of a main part of a surface processing apparatus according to a sixth embodiment.

FIG. 9 is a view showing a structure of a main part (main part including electron optical system and main chamber) of the surface processing apparatus in the present embodiment. As is shown in FIG. 9, the surface processing apparatus has the electron source 10 which generates an electron beam. The electron source 10 has a lens system provided therein which controls the beam shape of the electron beam. In addition, the surface processing apparatus has the stage 30 on which the inspection object 20 to be irradiated with the electron beam is set. Furthermore, the surface processing apparatus has the optical microscope 110 for checking a position to be irradiated with the electron beam.

The current value of the electron beam which irradiates the inspection object 20 is set at 10 nA to 100 A. The LaB6 cathode, the hollow cathode, the tungsten filament and the like can be used for the electron source 10. The voltage of 0 to −5,000 V is applied to the electron source 10, and the voltage of 0 to −2,000 V is applied to the inspection object 20. The landing energy LE is set at 0 to 5,000 eV.

In this case, the region which is irradiated with the electron beam can be controlled by the movement of the stage 30. The position to be irradiated with the electron beam can be checked with the use of the optical microscope 110. In addition, the region which is irradiated with the electron beam can be controlled by the combination of the control of the stage movement and the control of the blanking beam (dose control).

In the present embodiment, the electron source 10 is arranged below the stage 30 (below in vertical direction), and the inspection object 20 is set on the stage 30 so that the surface to be subjected to the surface processing faces downward (downward in vertical direction). Accordingly, as is shown in FIG. 9, the electron beam irradiates the inspection object 20 from below.

Such a surface processing apparatus of the present embodiment can also perform the surface processing on the inspection object 20 by irradiating the inspection object 20 with the electron beam. In this case, the inspection object 20 is set on the stage 30 so that the surface to be subjected to the surface processing faces downward, and the electron beam irradiates the inspection object 20 from below. Thereby, such a phenomenon can be decreased that foreign substances, particles and the like fall and are deposited on the surface to be subjected to the surface processing, due to gravity.

Incidentally, here, the structure in the first embodiment is reversed, and is structured so that the electron beam irradiates the inspection object 20 from below; but the structures also in other embodiments (second to fifth embodiments) may be reversed, and be structured so that the electron beam irradiates the inspection object 20 from below.

Seventh Embodiment

A structure of a surface processing apparatus in a seventh embodiment of the present invention will be described below with reference to the drawings. Incidentally, the overall structure of the surface processing apparatus is similar to that in the second embodiment, and accordingly the description will be omitted here.

Figure 10:
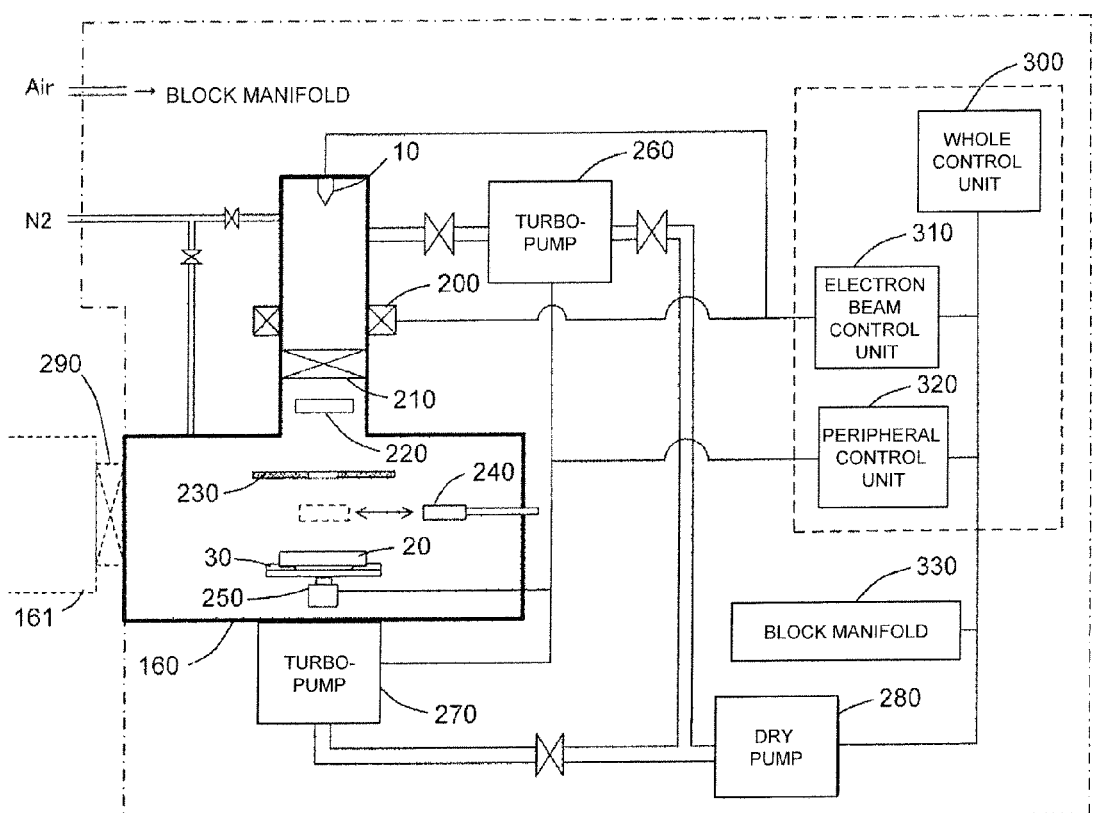
FIG. 10 is a view showing a structure of a main part of a surface processing apparatus according to a seventh embodiment.

FIG. 10 is a view showing a structure of a main part of the surface processing apparatus in the present embodiment. As is shown in FIG. 10, the surface processing apparatus has the electron source 10 such as a cathode, which generates an electron beam, a deflector 200 which deflects the electron beam, a gate valve 210 and a particle catcher 220 provided inside a column. In addition, the surface processing apparatus has a cover 230 (rectangular aperture) which covers the stage 30, a plate 240 (beam regulator) which is provided so as to be capable of being put into and taken out from the space between the cover 230 and the stage, and a lifting mechanism 250 which moves the stage 30 up and down provided inside the main chamber.

In addition, the surface processing apparatus has two turbo-pumps (turbo-pump 260 for column and turbo-pump 270 for main chamber), and one dry pump 280 provided therein. Furthermore, a gate valve 290 for transfer, which is used at the time when the inspection object (sample) is transferred or at a similar time, is provided between the main chamber and the transfer chamber.

In this case, the whole operation of the surface processing apparatus is controlled by a whole control unit 300, and the irradiation with and the deflection of the electron beam are controlled by a beam control unit 310. In addition, the vacuum pumps (turbo-pumps 260 and 270, and dry pump 280) and the lifting mechanism 250 are controlled by a peripheral control unit 320, and the opening and closing of the valve is controlled (with air pressure) by a block manifold 330.

Figure 11:
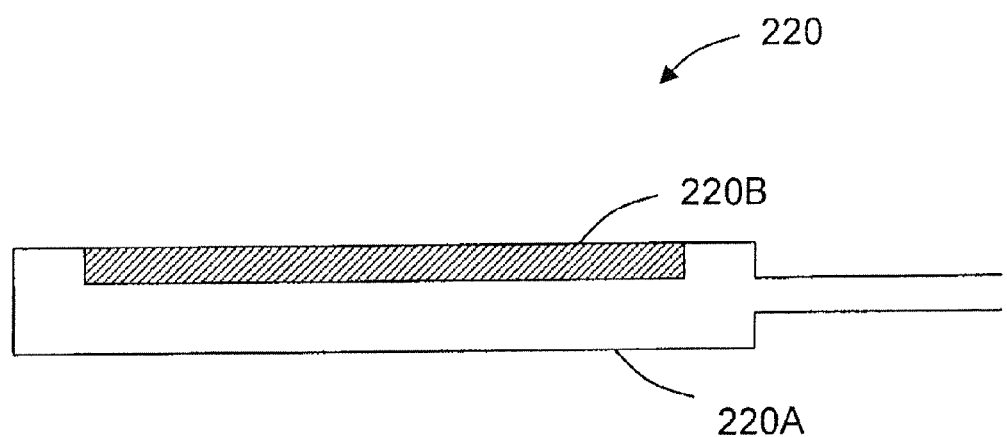
FIG. 11 is a view showing a structure of a particle catcher according to the seventh embodiment.

FIG. 11 is a view showing a structure of the particle catcher 220 in the present embodiment. As is shown in FIG. 11, the particle catcher 220 is structured of a base member 220A and an adsorbent 220B which is provided on the base member 220A. The adsorbent 220B is formed of $SiO_2$ gel or the like, for instance, and has a function of adsorbing particles which float in the column. By having the particle catcher 220, the surface processing apparatus can prevent the particles which float in the column from falling on the surface of the inspection object (sample) on the stage.

The particle catcher 220 is structured so as to be openable and closable (so as to be capable of being put into and taken out from column). Here, the state in which the particle catcher 220 is taken out from the column (is arranged above stage) means a state in which the particle catcher 220 is closed, and the state in which the particle catcher 220 is put into the column (is removed from above stage) means a state in which the particle catcher 220 is opened.

Figure 12:
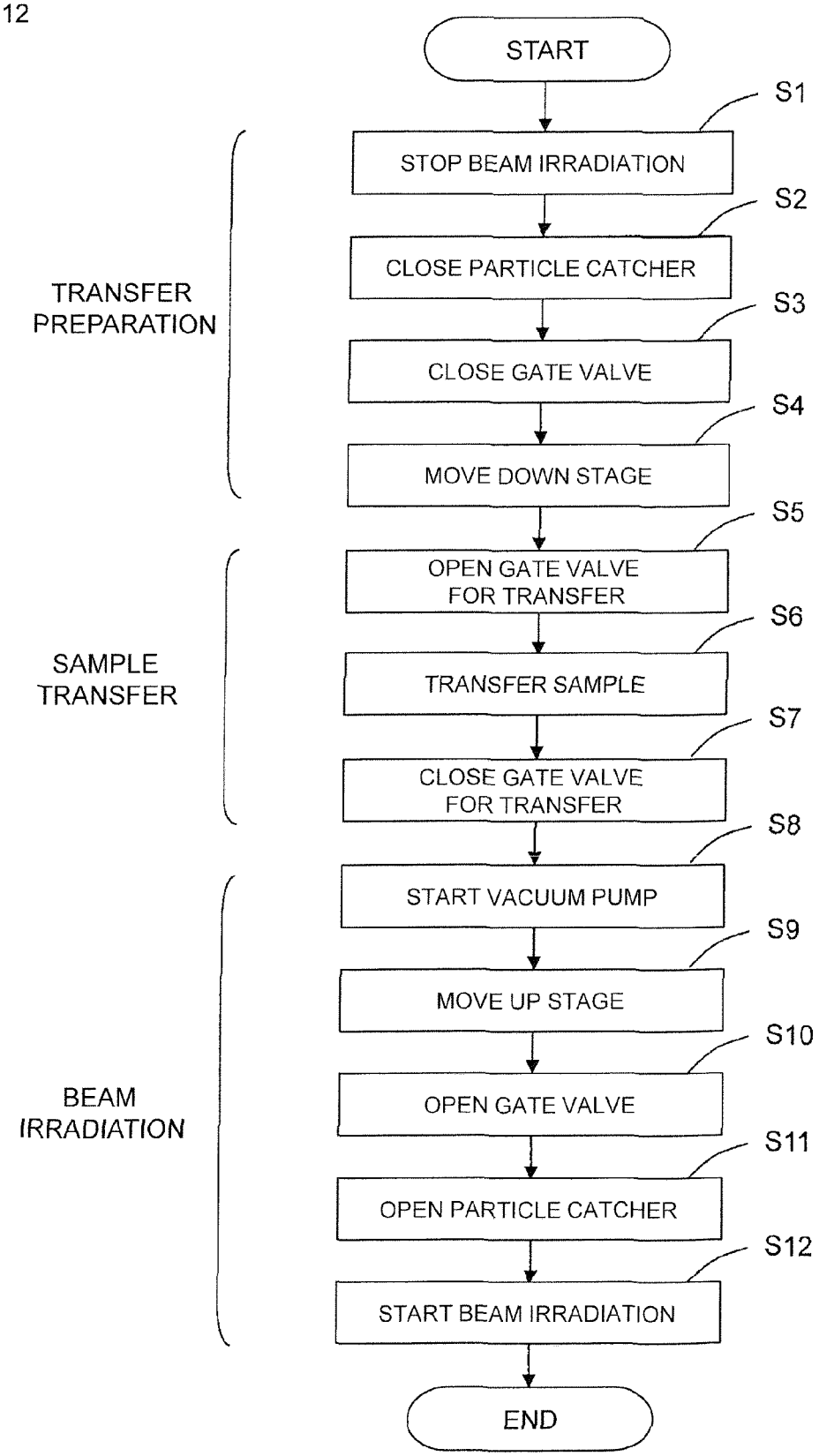
FIG. 12 is a flow chart showing a flow of operations (sample transfer and beam irradiation) of the surface processing apparatus according to the seventh embodiment.

FIG. 12 is a flow chart showing a flow of processing which is performed in the surface processing apparatus in the present embodiment, when a certain inspection object (sample) is irradiated with the beam, and after that, a next inspection object is transferred thereinto and irradiated with the beam. As is shown in FIG. 12, firstly, the beam stops irradiating the inspection object of which the surface processing has been completed (S1), and the particle catcher 220 is switched to a state of being closed (S2). Thereby, the particles can be prevented from falling on the inspection object. Then, the gate valve 210 is closed (S3), and at the same time, the stage is moved down by the lifting mechanism 250 (S4).

Next, the gate valve 290 for transfer is opened (S5), the next inspection object (sample) is transferred (S6), and the gate valve 290 for transfer is closed (S7). The vacuum pump starts (S8), and then the stage is moved up by the lifting mechanism 250 (S9). Incidentally, the processing of moving the stage up ends when the surface of the inspection object comes in contact with an application pin 340 (see FIG. 16 and FIG. 19). In the state in which the surface of the inspection object comes in contact with the application pin 340, a potential of the surface of the inspection object becomes GND. When the evacuation has been completed, the gate valve 210 is opened (S10), the particle catcher 220 is opened (S11), and the irradiation of the inspection object with the beam starts (S12).

Figure 13:
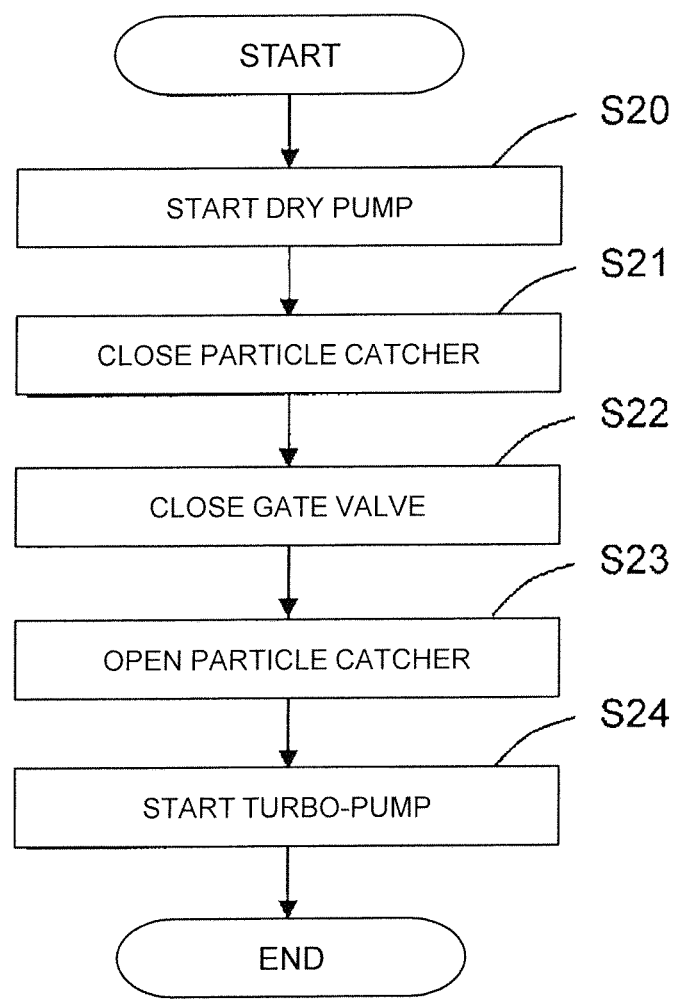
FIG. 13 is a flow chart showing a flow of an operation (evacuation) of the surface processing apparatus according to the seventh embodiment.

FIG. 13 is a flow chart showing a flow of the evacuation process which is performed in the surface processing apparatus in the present embodiment. As is shown in FIG. 13, when the evacuation is performed, firstly, the dry pump 280 is operated (S20). Then, the particle catcher 220 is closed (S21), and the gate valve 210 is closed (S22). After that, the particle catcher 220 is opened (S23), and the turbo-pump 270 is started (S24). Thus, before the turbo-pump 270 is started, the particle catcher 220 is opened. Thereby, the particles which have been adsorbed by the particle catcher 220 can be prevented from falling on the inspection object (by being affected by air current which is generated at the time of evacuation, and detached from particle catcher 220).

Eighth Embodiment

A structure of a surface processing apparatus in an eighth embodiment of the present invention will be described below with reference to the drawings. Incidentally, the overall structure of the surface processing apparatus is similar to that in the seventh embodiment, and accordingly the description will be omitted here.

Figure 14:
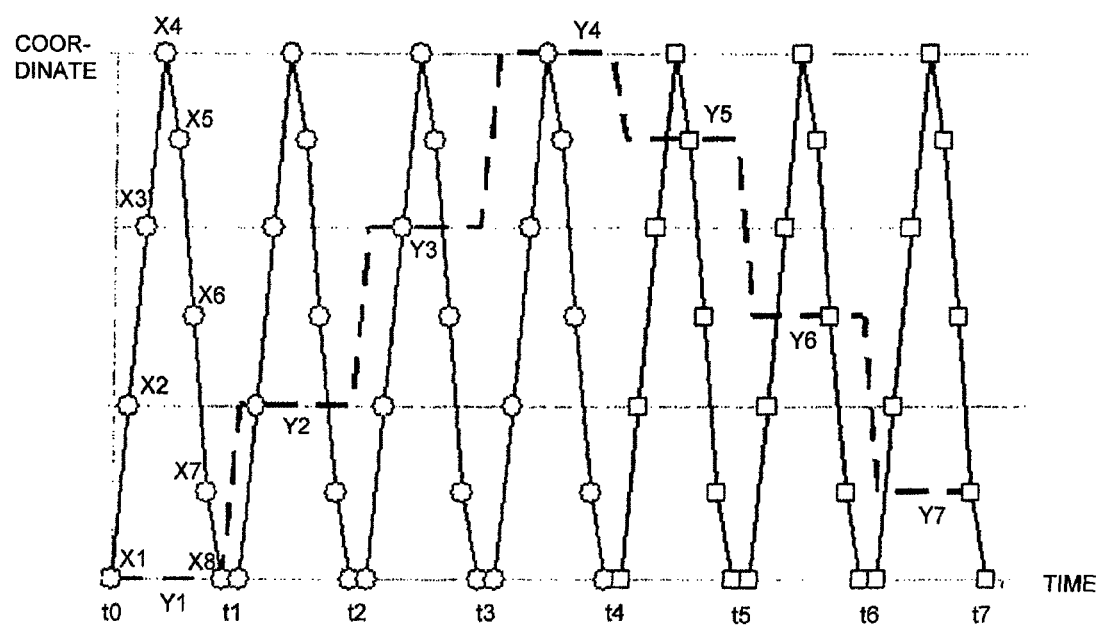
FIG. 14 is an explanatory view of an operation of a surface processing apparatus according to an eighth embodiment.
Figure 15:
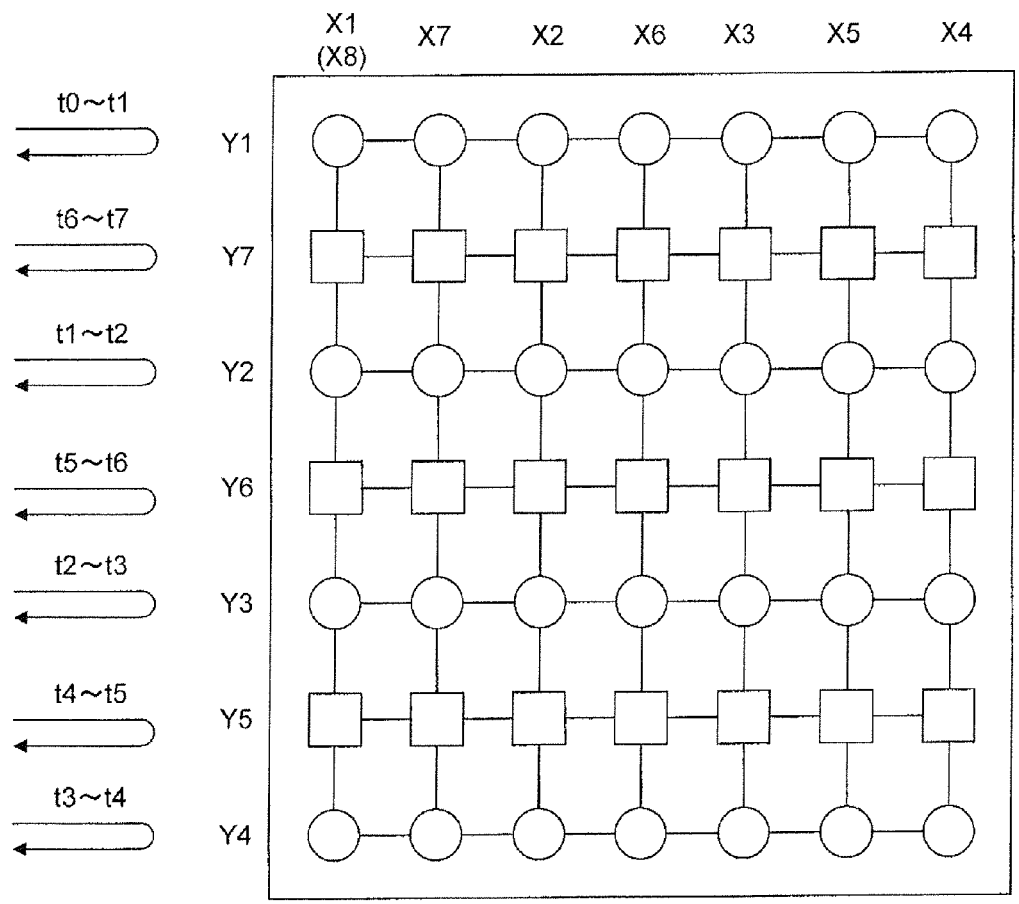
FIG. 15 is an explanatory view of the operation of the surface processing apparatus according to the eighth embodiment.

In the surface processing apparatus of the present embodiment, the electron beam is controlled so as to uniformly irradiate the surface of an inspection object, by being deflected in X-Y directions (two-dimensional directions on stage plane). FIG. 14 and FIG. 15 are explanatory views in which the electron beam is controlled so as to be deflected in the X-Y directions. More specifically, FIG. 14 is a view showing a change with time of the deflected electron beam on the coordinates (X coordinate and Y coordinate); and FIG. 15 is a plan view (plan view of inspection object viewed from electron beam source side) showing a state in which the electron beam is deflected in the X-Y directions.

In the example in FIG. 14 and FIG. 15, firstly, the electron beam is deflected in a direction in which the X coordinate becomes large (positive direction of X coordinate, and right direction in FIG. 15), (X1, X2, X3 and X4) from a time t0 to a time t1, and then is deflected in a direction in which the X coordinate becomes small (negative direction, and left direction in FIG. 15), (X4, X5, X6 and X7). At this time, the Y coordinate of the electron beam is fixed on Y1 and remains invariant. Then, when the electron beam comes to X8 (=X1) on the X coordinate, the electron beam is deflected in a direction in which the Y coordinate becomes large (positive direction of Y coordinate, and downward direction in FIG. 15), and the Y coordinate of the electron beam becomes Y2.

Similarly, from the time t1 to a time t2, the electron beam is deflected firstly in the direction in which the X coordinate becomes large (positive direction of X coordinate, and right direction in FIG. 15), (X1, X2, X3 and X4), and after that, is deflected in the direction in which the X coordinate becomes small (negative direction, and left direction in FIG. 15), (X4, X5, X6 and X7). At this time, the Y coordinate of the electron beam is fixed on Y2 and remains invariant. Then, when the electron beam comes to X8 (=X1) on the X coordinate, the electron beam is deflected in the direction in which the Y coordinate becomes large (positive direction of Y coordinate, and downward direction in FIG. 15), and the Y coordinate of the electron beam becomes Y3.

In addition, from the time t2 to a time t3, the electron beam is deflected firstly in the direction in which the X coordinate becomes large (positive direction of X coordinate, and right direction in FIG. 15), (X1, X2, X3 and X4), and after that, is deflected in the direction in which the X coordinate becomes small (negative direction, and left direction in FIG. 15), (X4, X5, X6 and X7). At this time, the Y coordinate of the electron beam is fixed on Y3 and remains invariant. Then, when the electron beam comes to X8 (=X1) on the X coordinate, the electron beam is deflected in the direction in which the Y coordinate becomes large (positive direction of Y coordinate, and downward direction in FIG. 15), and the Y coordinate of the electron beam becomes Y4.

Then, from the time t3 to a time t4, the electron beam is deflected firstly in the direction in which the X coordinate becomes large (positive direction of X coordinate, and right direction in FIG. 15), (X1, X2, X3 and X4), and after that, is deflected in the direction in which the X coordinate becomes small (negative direction, and left direction in FIG. 15), (X4, X5, X6 and X7). At this time, the Y coordinate of the electron beam is fixed on Y4 and remains invariant. Then, when the electron beam comes to X8 (=X1) on the X coordinate, this time, the electron beam is deflected in a direction in which the Y coordinate becomes small (negative direction of Y coordinate, and upward direction in FIG. 15), and the Y coordinate of the electron beam becomes Y5.

Similarly, from the time t4 to a time t5, the electron beam is deflected firstly in the direction in which the X coordinate becomes large (positive direction of X coordinate, and right direction in FIG. 15), (X1, X2, X3 and X4), and after that, is deflected in the direction in which the X coordinate becomes small (negative direction, and left direction in FIG. 15), (X4, X5, X6 and X7). At this time, the Y coordinate of the electron beam is fixed on Y5 and remains invariant. Then, when the electron beam comes to X8 (=X1) on the X coordinate, the electron beam is deflected in the direction in which the Y coordinate becomes small (negative direction of Y coordinate, and upward direction in FIG. 15), and the Y coordinate of the electron beam becomes Y6.

In addition, from the time t5 to a time t6, the electron beam is deflected firstly in the direction in which the X coordinate becomes large (positive direction of X coordinate, and right direction in FIG. 15), (X1, X2, X3 and X4), and after that, is deflected in the direction in which the X coordinate becomes small (negative direction, and left direction in FIG. 15), (X4, X5, X6 and X7). At this time, the Y coordinate of the electron beam is fixed on Y6 and remains invariant. Then, when the electron beam comes to X8 (=X1) on the X coordinate, the electron beam is deflected in the direction in which the Y coordinate becomes small (negative direction of Y coordinate, and upward direction in FIG. 15), and the Y coordinate of the electron beam becomes Y7.

Then, from the time t6 to a time t7, the electron beam is firstly deflected in the direction in which the X coordinate becomes large (positive direction of X coordinate, and right direction in FIG. 15), (X1, X2, X3 and X4), and after that, is deflected in the direction in which the X coordinate becomes small (negative direction, and left direction in FIG. 15), (X4, X5, X6 and X7). At this time, the Y coordinate of the electron beam is fixed on Y7 and remains invariant. Then, when the electron beam comes to X8 (=X1) on the X coordinate, the electron beam is deflected in the direction in which the Y coordinate becomes small (negative direction of Y coordinate, and upward direction in FIG. 15), and the Y coordinate of the electron beam becomes Y1.

Thus, from the time t0 to the time t7, the electron beam is controlled to be deflected in the X-Y directions. In this case, the surface processing apparatus deflects the electron beam so that the position to be irradiated with the electron beam in the direction in which the coordinate becomes large comes to a different position in each of the X coordinate and the Y coordinate, from the position to be irradiated with the electron beam in the direction in which the coordinate becomes small. Specifically, when moving the electron beam back and forth in the X-Y directions by deflecting the electron beam, the surface processing apparatus irradiates different positions between an outward path (when value of coordinate becomes large) and a return path (when value of coordinate becomes small), with the electron beam. Thereby, the surface processing apparatus can uniformly irradiate the surface of the inspection object with the electron beam.

Incidentally, in the example of FIG. 14 and FIG. 15, a magnitude relation on the X coordinate is "X1<X7<X2<X6<X3<X5<X4", and a magnitude relation on the Y coordinates is "Y1<Y7<Y2<Y6<Y3<Y5<Y4". In addition, in FIG. 14 and FIG. 15, the positions to be irradiated with the electron beam at the time t0 to the time t4 are shown by a round mark, and the positions to be irradiated with the electron beam at the time t4 to the time t7 are shown by a square mark. In the example, the positions (on X-Y coordinates) to be irradiated with the electron beam are expressed by discrete values, but the scope of the present invention is not limited to the discrete value.

Ninth Example

A structure of a surface processing apparatus in a ninth embodiment of the present invention will be described below with reference to the drawings. Incidentally, the overall structure of the surface processing apparatus is similar to that in the seventh embodiment, and accordingly the description will be omitted here.

Figure 16:
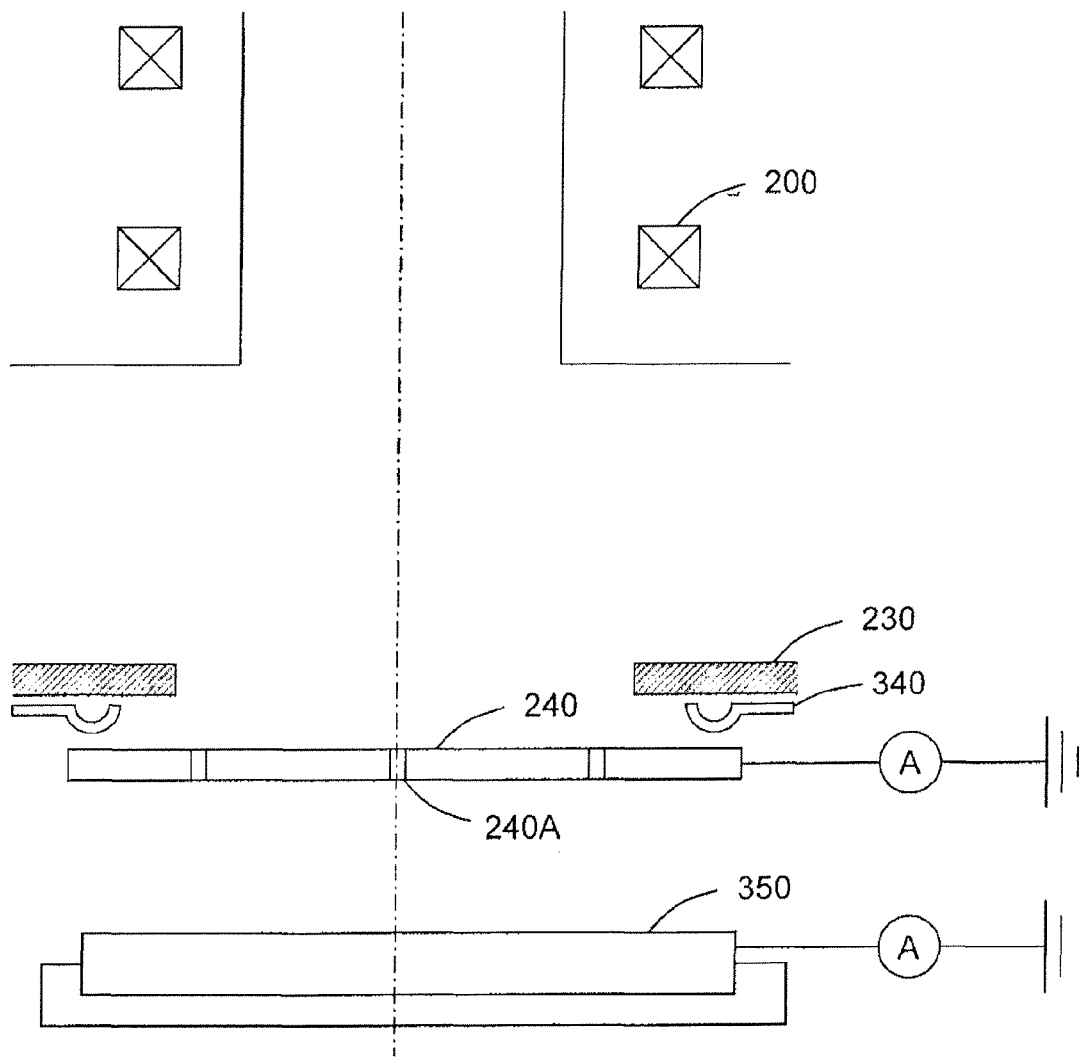
FIG. 16 is a view showing a structure of a main part of a surface processing apparatus according to a ninth embodiment.

FIG. 16 is a view showing a structure of a main part of the surface processing apparatus in the present embodiment. As is shown in FIG. 16, this surface processing apparatus has an absorbing electrode 350 provided therein. The absorbing electrode 350 is an electrode for measuring the amount of the electron beam which has reached this electrode (amount of electron beam which has been absorbed by this electrode), as a current value. Specifically, this surface processing apparatus is structured so as to be capable of measuring the amount of the electron beam which has been absorbed by the absorbing electrode 350. In addition, this surface processing apparatus is structured so as to be capable of measuring also the amount of the electron beam which has been absorbed by the plate 240 (beam regulator).

FIG. 17 is a view showing a structure of the plate 240 and the cover 230 in the present embodiment. As is shown in FIG. 17, the plate 240 has a plurality of beam holes 240A (small beam holes) provided therein, and one beam hole 240A out of the beam holes is provided in the center of the plate 240. A deflection value can be set (preparation of table of deflection values), with the use of this beam hole 240A. This plate 240 has also a beam hole 240B (large beam hole) provided therein which can pass the whole beam therethrough without blocking the beam. The amount of the whole beam can be measured with the use of this beam hole 240B. Incidentally, in the example of FIG. 17, the case has been illustrated in which there are nine beam holes 240A, but the scope of the present invention is not limited to the number. The number of the beam holes 240A may be a number other than nine holes (for instance, five holes). In addition, the beam hole 240B may not be provided.

As is shown in FIG. 17, the cover 230 has a rectangular shape as a whole, and has a rectangular hole provided in the center thereof. It can be also said that the cover 230 has a rectangular ring shape. The size of the hole in the center of the cover 230 is set smaller than the size of the inspection object (sample). The size of the absorbing electrode 350 is almost the same as the size of the inspection object. Accordingly, the size of the hole in the center of the cover 230 is set smaller than the size of the absorbing electrode 350 (see FIG. 16). In addition, the size of the hole in the center of the cover 230 is set smaller than the size of the plate 240 (see FIG. 16).

Figure 18:
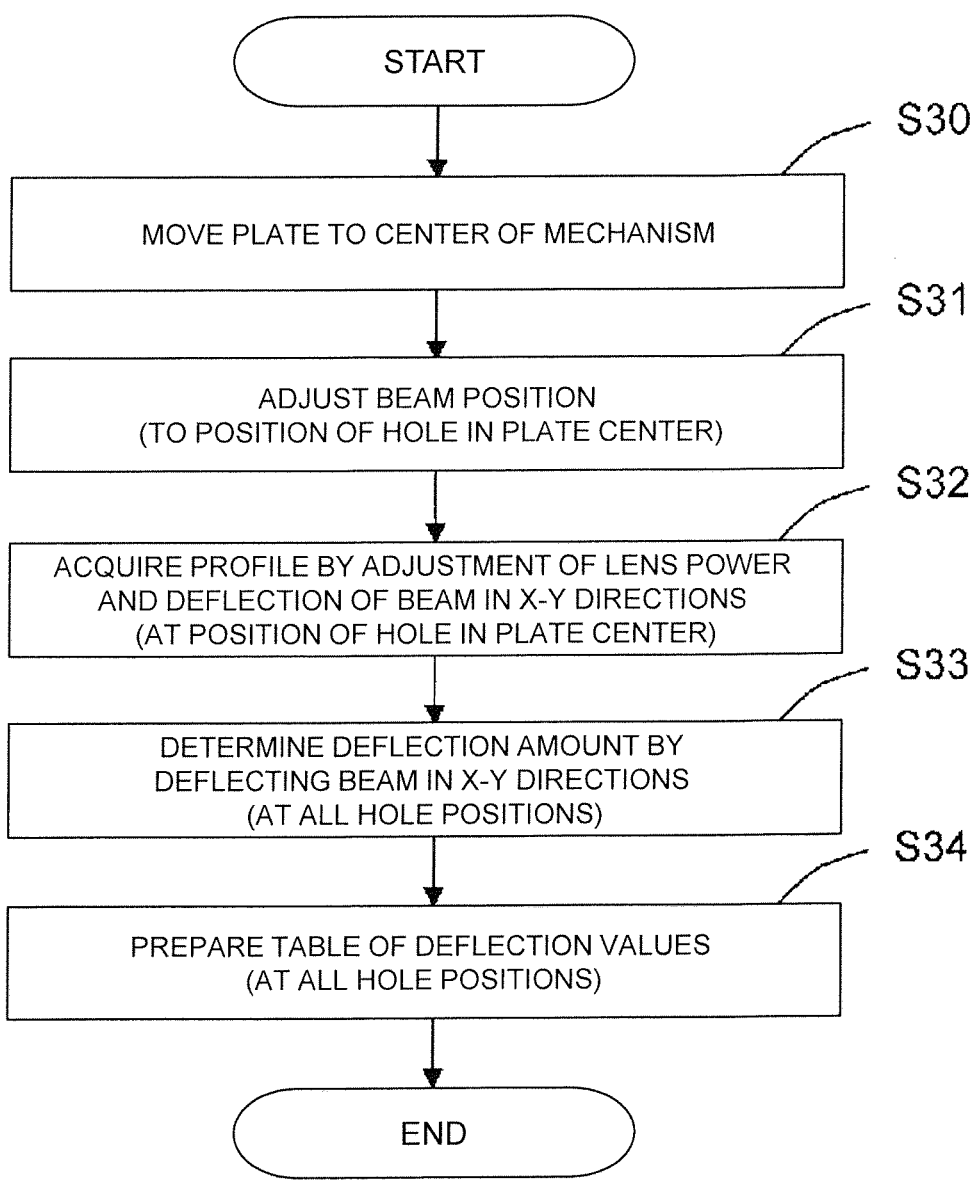
FIG. 18 is a flow chart showing a flow of an operation of the surface processing apparatus according to the ninth embodiment.

The surface processing apparatus according to the present embodiment can set a deflection value (preparation of table of deflection values). FIG. 18 is a flow chart showing a flow of the operation. In this surface processing apparatus, firstly, the plate 240 is moved to the center of the mechanism (S30), as is shown in FIG. 16. Next, the position to be irradiated with the electron beam is deflected, and is adjusted to the position of the beam hole 240A in the center of the plate 240 (S31). A profile of the electron beam which passes through the beam hole 240A in the center of the plate 240 (profile of absorption current of absorbing electrode 350) is acquired by an operation of adjusting a lens power and deflecting the electron beam in the X-Y directions from this state (S32). At this time, the lens power is adjusted so as to satisfy such a condition that a half-value width of the profile of the absorption current becomes a predetermined target value. After that, the deflection amount of the electron beam in the X-Y directions is adjusted, and the deflection amounts of all the beam holes 240A are determined (S33). Specifically, the deflection amount (which corresponds to position of beam hole 240A), in which the absorption current of the absorbing electrode 350 becomes the maximum value, is determined for all of the beam holes 240A. The table of the deflection values is prepared on the basis of the deflection amounts (deflection amounts in X-Y directions) of the electron beam and the positions (on X-Y coordinates) of the beam holes 240A, which have been determined in the above way (S34). In the table of the deflection values, the deflection amounts (deflection amounts in X-Y directions) of the electron beam are arranged so as to correspond to the positions (X-Y coordinates) of the beam holes 240A.

In addition, the surface processing apparatus according to the present embodiment can measure the amount of the whole beam, by using the beam hole 240E of the plate 240. For instance, the surface processing apparatus can measure the amount of the whole beam by measuring an absorption current (absorption current in absorbing electrode 350) of the electron beam, in the state of making the beam hole 240B of the plate 240 pass the whole beam therethrough. In addition, when the beam hole 240B is not provided in the plate 240, the surface processing apparatus can measure the amount of the whole beam, by measuring the absorption current of the plate 240 in the state of making the whole beam irradiate the plate 240.

Figure 19:
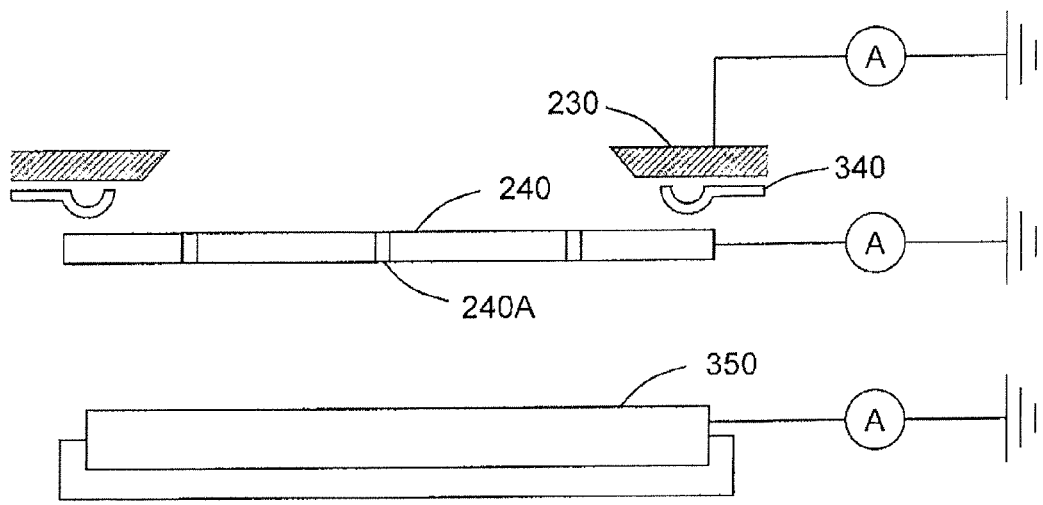
FIG. 19 is a view showing a structure of a modified example of the surface processing apparatus according to the ninth embodiment.

FIG. 19 is a view showing a structure of a modified example of the surface processing apparatus in the present embodiment. As is shown in FIG. 19, in this modified example, the edge of the inner circumference of the cover 230 is formed into a tapered shape. The angle of the tapered shape is preferably 60 degrees or less, and in the example of FIG. 19, the angle is set at approximately 45 degrees. In addition, in this modified example, the surface processing apparatus is structured so as to be capable of measuring also the amount of the electron beam (absorption current) which has been absorbed by the cover 230.

This surface processing apparatus can measure the shape of the electron beam by using the absorption current of the cover 230. When the surface processing apparatus is continuously used for a long period of time (for instance, 1,000 hours or longer), the shape of the electron beam can occasionally change due to various factors. This surface processing apparatus can measure the shape of the electron beam, and accordingly can periodically manage the shape of the electron beam.

Figure 20:
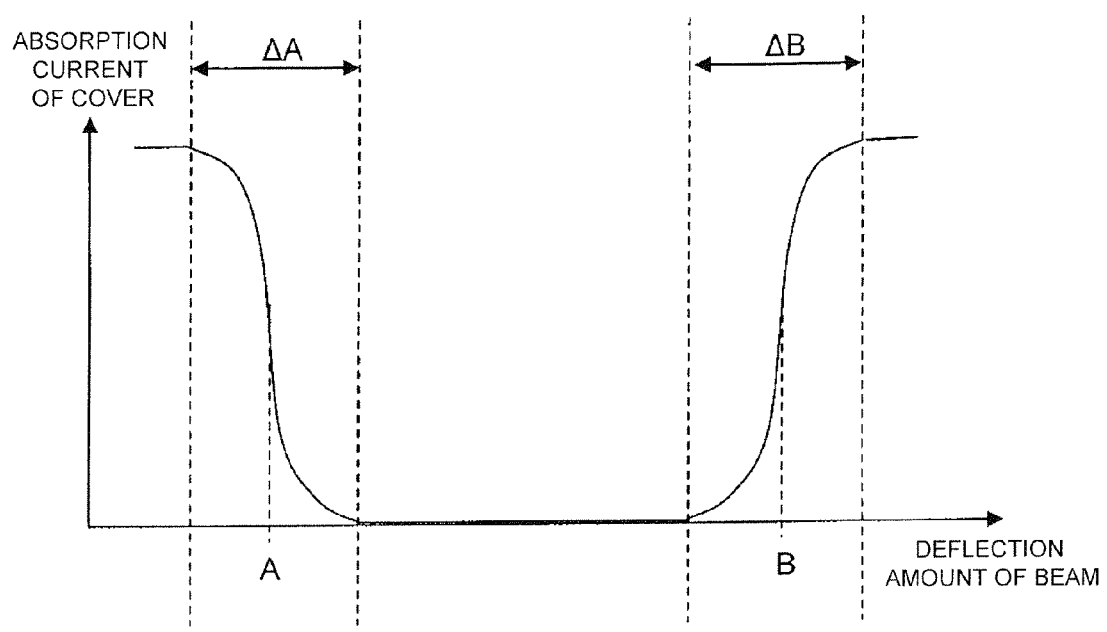
FIG. 20 is a view showing a change of an absorption current by a cover with respect to a deflection amount of a beam according to the ninth embodiment.

Specifically, as is shown in FIG. 20, the surface processing apparatus measures the change in the amount of the absorption current in the edge of the inner circumference of the cover 230, by deflecting the electron beam in the X-Y directions. Then, the surface processing apparatus measures, for instance, the deflection amount (for instance, A or B in FIG. 20) at a position at which the current value of the absorption current of the cover 230 becomes a half value (half of maximum value), and determines whether a deviation between the deflection amount and a reference value (reference value of deflection amount) is within a predetermined range (for instance, 5% or less). When the deviation between the deflection amount and the reference value is within the predetermined range, it is determined that the shape of the electron beam is "not abnormal", and when the deviation is not within the predetermined value, it is determined that the shape of the electron beam is "abnormal".

In addition, the surface processing apparatus measures, for instance, a width A (for instance, AA or AB in FIG. 20) between the deflection amount at which the current value of the absorption current of the cover 230 becomes the maximum value and the deflection amount at which the above current value becomes the minimum value, and determines whether a deviation between the width and the reference value (reference value of width of deflection amount) is within a predetermined range (for instance, ±10% or less). When the deviation between the deflection amount and the reference value is within the predetermined range, it is determined that the shape of the electron beam is "not abnormal", and when the deviation is not within the predetermined value, it is determined that the shape of the electron beam is "abnormal". Thus, it becomes possible for the surface processing apparatus to measure the shape of the electron beam and periodically manage the shape of the electron beam.

Figure 21:
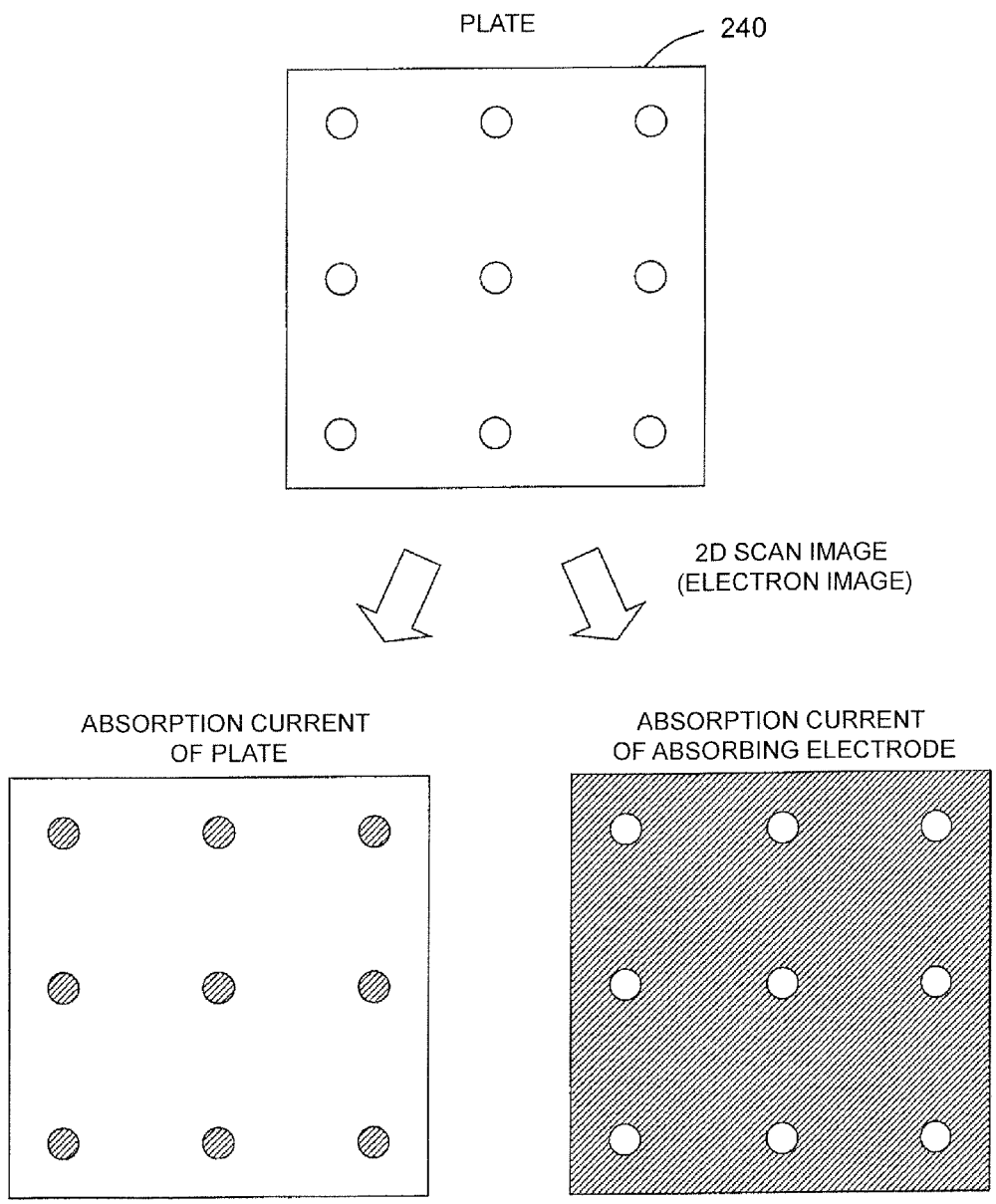
FIG. 21 is an explanatory view of a 2D scan image (electron image) of the plate according to the ninth embodiment.

The surface processing apparatus according to the present embodiment can also take a picture of a 2D scan image (electron image) of the plate 240. FIG. 21 is one example of the 2D scan image (electron image) of the plate 240. As is shown in FIG. 21, the 2D scan image of the plate 240 can be acquired from the absorption current of the plate 240, and can be acquired also from the absorption current of the absorbing electrode 350. Thus, the surface processing apparatus can grasp, for instance, the positions and the shapes of the beam holes 240A and 240B of the plate 240 from a two-dimensional image, by taking the picture of the 2D scan image (electron image) of the plate 240.

Figure 22:
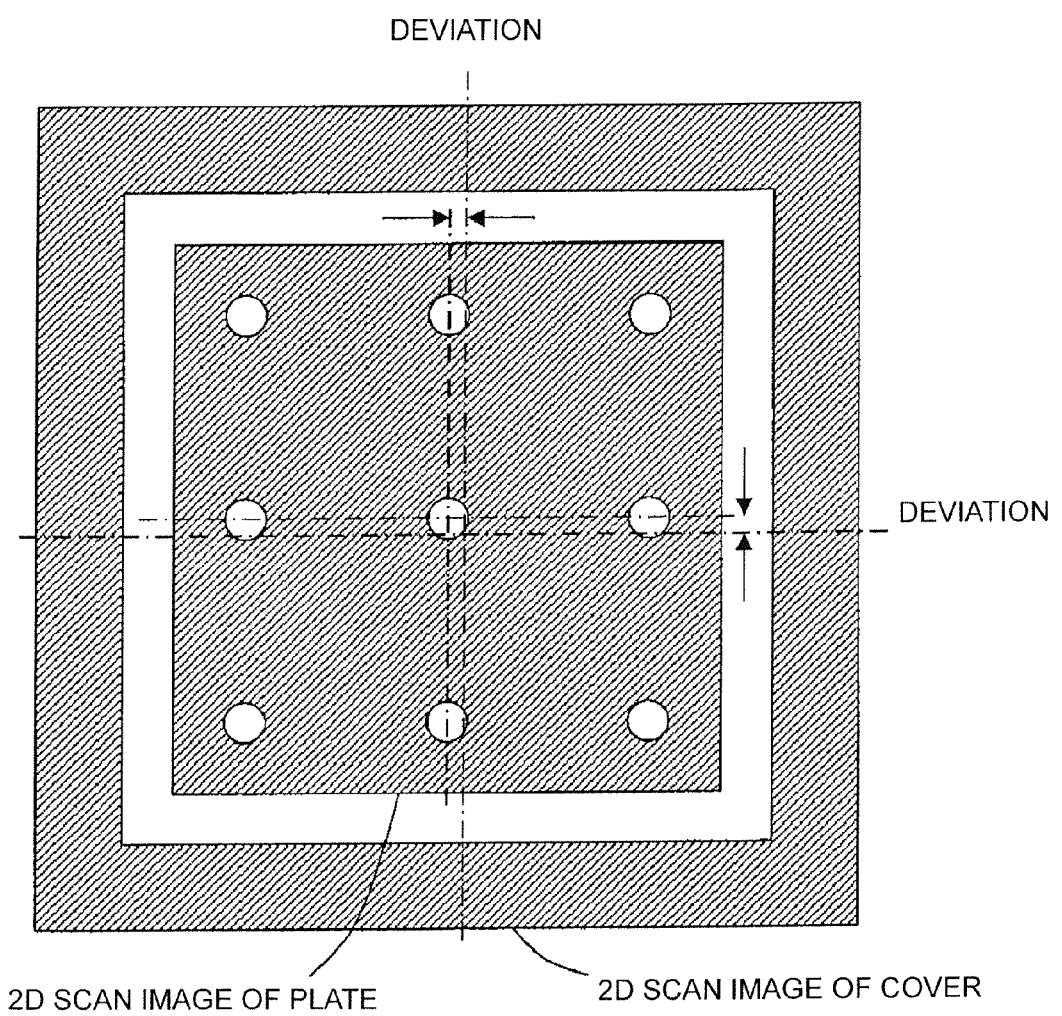
FIG. 22 is an explanatory view of deviation between the cover and the plate according to the ninth embodiment.

Furthermore, the surface processing apparatus can acquire also the 2D scan image (electron image) of the cover 230 from the absorption current of the cover 230, as is shown in FIG. 22. In this case, the surface processing apparatus can grasp the position and the shape of the cover 230 from the two-dimensional image. Furthermore, the surface processing apparatus can grasp also the deviation of the cover 230 and the above described plate 240 in the X-Y directions, by comparing the 2D scan image of the cover 230 with the 2D scan image of the plate 240.

As has been described above, the embodiments of the present invention have been described by the exemplification, but the scope of the present invention is not limited to these embodiments, and can be changed and modified according to the purpose in the range described in the claims.

What is claimed is:

1. A surface processing apparatus which performs surface processing on an inspection object by irradiating the inspection object with an electron beam in a column, comprising:
   an electron source which generates the electron beam;
   a lens system which controls a beam shape of the electron beam;
   a stage on which the inspection object to be irradiated with the electron beam is set;
   an optical microscope for checking a position to be irradiated with the electron beam, wherein a current value of the electron beam which irradiates the inspection object is set at 10 nA to 100 A; and
   a particle catcher that can adsorb particles which float in the column, wherein the particle catcher is openable and closeable such that the particle catcher is arranged above the stage when closed and is removed from above the stage when opened.

2. The surface processing apparatus according to claim 1, wherein
   the inspection object has a circular shape,
   a region which is irradiated with the electron beam has a fan shape, and
   the surface processing apparatus comprises a stage control unit which rotationally moves the stage so that a whole surface of the inspection object can be irradiated with the electron beam.

3. The surface processing apparatus according to claim 1, wherein
   the inspection object has a rectangular shape,
   a region which is irradiated with the electron beam has a rectangular shape with a smaller size than that of the inspection object, and
   the surface processing apparatus comprises a stage control unit which translationally moves the stage so that a whole surface of the inspection object can be irradiated with the electron beam.

4. The surface processing apparatus according to claim 1, wherein
   the electron source is arranged below the stage,
   the inspection object is set on the stage so that a surface to be subjected to the surface processing faces downward, and the electron beam irradiates the inspection object from below.

5. A surface processing apparatus which performs surface processing on an inspection object by irradiating the inspection object with an electron beam, comprising:
   an electron source which generates the electron beam;
   a lens system which controls a beam shape of the electron beam;
   a stage on which the inspection object to be irradiated with the electron beam is set;
   an optical microscope for checking a position to be irradiated with the electron beam, wherein a current value of the electron beam which irradiates the inspection object is set at 10 nA to 100 A;
   a beam regulator having a beam hole through which the electron beam can pass and which measures, as a current value, an amount of the beam electrode that reaches the beam regulator; and
   an absorbing electrode which measures, as a current value, an amount of the electron beam which passes through the beam hole and reaches the absorbing electrode.

6. The surface processing apparatus according to claim 5, wherein
   the inspection object has a circular shape,
   a region which is irradiated with the electron beam has a fan shape, and
   the surface processing apparatus further comprises a stage control unit which rotationally moves the stage so that a whole surface of the inspection object can be irradiated with the electron beam.

7. The surface processing apparatus according to claim 5, wherein
   the inspection object has a rectangular shape,
   a region which is irradiated with the electron beam has a rectangular shape with a smaller size than that of the inspection object, and
   the surface processing apparatus further comprises a stage control unit which translationally moves the stage so that a whole surface of the inspection object can be irradiated with the electron beam.

8. The surface processing apparatus according to claim 5, wherein
   the electron source is arranged below the stage,
   the inspection object is set on the stage so that a surface to be subjected to the surface processing faces downward, and
   the electron beam irradiates the inspection object from below.

* * * * *